US012751282B2

(12) United States Patent
Huang

(10) Patent No.: US 12,751,282 B2
(45) Date of Patent: Sep. 29, 2026

(54) SEMICONDUCTOR DEVICE STRUCTURE WITH DIELECTRIC LINER PORTIONS AND METHOD FOR PREPARING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 395 days.

(21) Appl. No.: 18/380,893

(22) Filed: Oct. 17, 2023

(65) Prior Publication Data

US 2024/0266294 A1 Aug. 8, 2024

Related U.S. Application Data

(62) Division of application No. 18/105,340, filed on Feb. 3, 2023.

(51) Int. Cl.

| | |
|---|---|
| ***H10W 20/47*** | (2026.01) |
| ***H10W 20/00*** | (2026.01) |
| ***H10W 20/46*** | (2026.01) |

(52) U.S. Cl.

CPC ......... *H10W 20/47* (2026.01); *H10W 20/063* (2026.01); *H10W 20/072* (2026.01); *H10W 20/098* (2026.01); *H10W 20/46* (2026.01)

(58) Field of Classification Search

CPC ............. H10W 20/72; H10W 20/0765; H10W 20/063; H10W 20/0633; H10W 20/098

See application file for complete search history.

(56) References Cited

U.S. PATENT DOCUMENTS 6,423,630 B1 * 7/2002 Catabay .............. H10W 20/074 438/789
2010/0093168 A1 4/2010 Naik
(Continued)

FOREIGN PATENT DOCUMENTS

CN 114520187 A 5/2022
KR 20100072556 A 7/2010
(Continued)

OTHER PUBLICATIONS

Office Action and and the search report mailed on Aug. 6, 2024 related to U.S. Appl. No. 18/105,340, wherein this application is a DIV of U.S. Appl. No. 18/105,340.
(Continued)

*Primary Examiner* — Erik Kielin
(74) *Attorney, Agent, or Firm* — Xuan Zhang

(57) ABSTRACT

A semiconductor device structure includes a first dielectric layer disposed over a semiconductor substrate, and a second dielectric layer disposed over the first dielectric layer. The semiconductor device structure also includes a first interconnect structure and a second interconnect structure disposed over the second dielectric layer. The semiconductor device structure further includes a first dielectric liner portion disposed adjacent to the first interconnect structure. An air gap is enclosed in the first dielectric liner portion. In addition, the semiconductor device structure includes a second dielectric liner portion disposed adjacent to the second interconnect structure, and a filling portion surrounded by the second dielectric liner portion.

8 Claims, 20 Drawing Sheets

(56) References Cited

U.S. PATENT DOCUMENTS

| | | | | |
|---|---|---|---|---|
| 2015/0287682 | A1* | 10/2015 | Ahn | H10W 20/47 257/773 |
| 2018/0151490 | A1* | 5/2018 | Yim | H10W 20/495 |
| 2019/0206718 | A1* | 7/2019 | LiCausi | H10W 20/072 |
| 2021/0098292 | A1* | 4/2021 | Nguyen | H10W 20/071 |
| 2021/0305087 | A1* | 9/2021 | Parikh | H10W 20/098 |
| 2021/0391261 | A1* | 12/2021 | Liao | H10W 20/072 |
| 2022/0415804 | A1* | 12/2022 | Yao | H10W 20/072 |
| 2023/0197603 | A1 | 6/2023 | Chen et al. | |
| 2024/0038528 | A1 | 2/2024 | Cheng et al. | |
| 2024/0071966 | A1 | 2/2024 | Surthi | |

FOREIGN PATENT DOCUMENTS

| | | | |
|---|---|---|---|
| TW | 201417188 | A | 5/2014 |
| TW | 202226356 | A | 7/2022 |
| TW | 202236576 | A | 9/2022 |

OTHER PUBLICATIONS

English abstract of the foreign patent document KR20100072556A.
Office Action and the search report mailed on Oct. 20, 2023 related to Taiwanese Application No. 112120467.
Office Action and and the search report mailed on Dec. 9, 2025 related to U.S. Appl. No. 18/105,340, wherein this application is a DIV of U.S. Appl. No. 18/105,340.

* cited by examiner

SEMICONDUCTOR DEVICE STRUCTURE WITH DIELECTRIC LINER PORTIONS AND METHOD FOR PREPARING THE SAME

CROSS-REFERENCE TO RELATED APPLICATION

This application is a divisional application of U.S. Non-Provisional application Ser. No. 18/105,340 filed Feb. 3, 2023, which is incorporated herein by reference in its entirety.

TECHNICAL FIELD

The present disclosure relates to a semiconductor device structure and a method for preparing the same, and more particularly, to a semiconductor device structure with dielectric liner portions and a method for preparing the same.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first interconnect structure and a second interconnect structure disposed over the second dielectric layer. The semiconductor device structure further includes a first dielectric liner portion disposed adjacent to the first interconnect structure. An air gap is enclosed in the first dielectric liner portion. In addition, the semiconductor device structure includes a second dielectric liner portion disposed adjacent to the second interconnect structure, and a filling portion surrounded by the second dielectric liner portion.

In an embodiment, a bottom width of the second dielectric liner portion is greater than a bottom width of the first dielectric liner portion. In an embodiment, a material of the first dielectric liner portion is the same as a material of the second dielectric liner portion. In an embodiment, the material of the first dielectric liner portion and the material of the second dielectric liner portion include boron carbonitride (BCN). In an embodiment, the filling portion is separated from the second dielectric layer by the second dielectric liner portion. In an embodiment, the filling portion is separated from the second interconnect structure by the second dielectric liner portion.

In an embodiment, the semiconductor device further includes a cover layer disposed over and in direct contact with the first interconnect structure, the second interconnect structure, the first dielectric liner portion, the second dielectric liner portion, and the filling portion. In an embodiment, the cover layer includes silicon nitride ($Si_3N_4$), silicon oxynitride (SiON), silicon dioxide ($SiO_2$), or carbonitride. In an embodiment, each of the first interconnect structure and the second interconnect structure includes a first conductive portion and a second conductive portion disposed over the first conductive portion. In an embodiment, the first liner portion is in direct contact with the first conductive portion and the second conductive portion of the first interconnect structure, and the second liner portion is in direct contact with the first conductive portion and the second conductive portion of the second interconnect structure. In an embodiment, the filling portion includes a low-k dielectric material. In an embodiment, the filling portion includes an energy removable material.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first interconnect structure and a second interconnect structure disposed over the second dielectric layer. The semiconductor device structure further includes a first dielectric liner portion disposed adjacent to the first interconnect structure, and a second dielectric liner portion disposed adjacent to the second interconnect structure. In addition, the semiconductor device structure includes a first filling portion surrounded by the first dielectric liner portion, and a second filling portion surrounded by the second dielectric liner portion. A material of the first filling portion is the same as a material of the second filling portion, and a width of the second filling portion is greater than a width of the first filling portion.

In an embodiment, a bottom width of the second dielectric liner portion is greater than a bottom width of the first dielectric liner portion. In an embodiment, a material of the first dielectric liner portion is the same as a material of the second dielectric liner portion. In an embodiment, the material of the first dielectric liner portion and the material of the second dielectric liner portion include boron carbonitride (BCN). In an embodiment, the first filling portion is separated from the second dielectric layer by the first dielectric liner portion, and the second filling portion is separated from the second dielectric layer by the second dielectric liner portion. In an embodiment, the first filling portion is separated from the first interconnect structure by the first dielectric liner portion, and the second filling portion is separated from the second interconnect structure by the second dielectric liner portion.

In an embodiment, the semiconductor device structure further includes a cover layer disposed over and in direct contact with the first interconnect structure, the second interconnect structure, the first dielectric liner portion, the second dielectric liner portion, the first filling portion, and the second filling portion. In an embodiment, the cover layer includes silicon nitride ($Si_3N_4$), silicon oxynitride (SiON), silicon dioxide ($SiO_2$), or carbonitride. In an embodiment, the semiconductor device structure further includes a third interconnect structure and a fourth interconnect structure disposed over the second dielectric layer, wherein the first dielectric liner portion is disposed between the first interconnect structure and the third interconnect structure, and the second dielectric liner portion is disposed between the second interconnect structure and the fourth interconnect structure. In an embodiment, the first dielectric liner portion is in direct contact with the first interconnect structure and the third interconnect structure, and the second dielectric liner portion is in direct contact with the second interconnect structure and the fourth interconnect structure. In an embodiment, the material of the first filling portion and the material of the second filling portion include a low-k dielectric material. In an embodiment, the material of the first filling portion and the material of the second filling portion include an energy removable material.

In yet another embodiment of the present disclosure, a method for preparing a semiconductor device structure is provided. The method includes forming a first dielectric layer over a semiconductor substrate, and forming a second dielectric layer over the first dielectric layer. The method also includes forming a first conductive layer over the second dielectric layer, and forming a second conductive layer over the first conductive layer. The method further includes forming a first opening and a second opening each penetrating through the first conductive layer and the second conductive layer. A width of the second opening is greater than a width of the first opening. In addition, the method includes forming a dielectric liner layer in the first opening and the second opening, and forming a filling layer over the dielectric liner layer. A remaining portion of the second opening is filled by the filling layer. The method also includes partially removing the filling layer and the dielectric liner layer to expose the second conductive layer.

In an embodiment, the filling layer is formed by a sputtering process. In an embodiment, a top surface area of the second dielectric layer exposed by the second opening is greater than a top surface area of the second dielectric layer exposed by the first opening. In an embodiment, an air gap is enclosed in a portion of the dielectric liner layer in the first opening. In an embodiment, the air gap is formed before the filling layer is formed. In an embodiment, after the dielectric liner layer is formed, a remaining portion of the first opening is filled by the filling layer, and a width of the remaining portion of the second opening filled by the filling layer is greater than a width of the remaining portion of the first opening filled by the filling layer.

In an embodiment, the method further includes forming a cover layer over the second conductive layer after the filling layer and the dielectric liner layer are partially removed, wherein the cover layer is in direct contact with a remaining portion of the filling layer in the second opening. In an embodiment, the cover layer is in direct contact with a remaining portion of the filling layer in the first opening. In an embodiment, the filling layer includes a low-k dielectric material. In an embodiment, the filling layer includes an energy removable material.

Embodiments of a semiconductor device structure and method for preparing the same are provided in the disclosure. In some embodiments, the semiconductor device structure includes a first dielectric liner portion disposed adjacent to a first interconnect structure, and a second dielectric liner portion disposed adjacent to a second interconnect structure. The semiconductor device structure also includes a filling portion surrounded by the second dielectric liner portion, and an air gap is enclosed in the first dielectric liner portion, which helps to reduce the capacitive coupling between adjacent interconnect structures, and resistance-capacitance (RC) delay can be decreased. As a result, performance (e.g., operation speed) and reliability of the semiconductor device structure can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
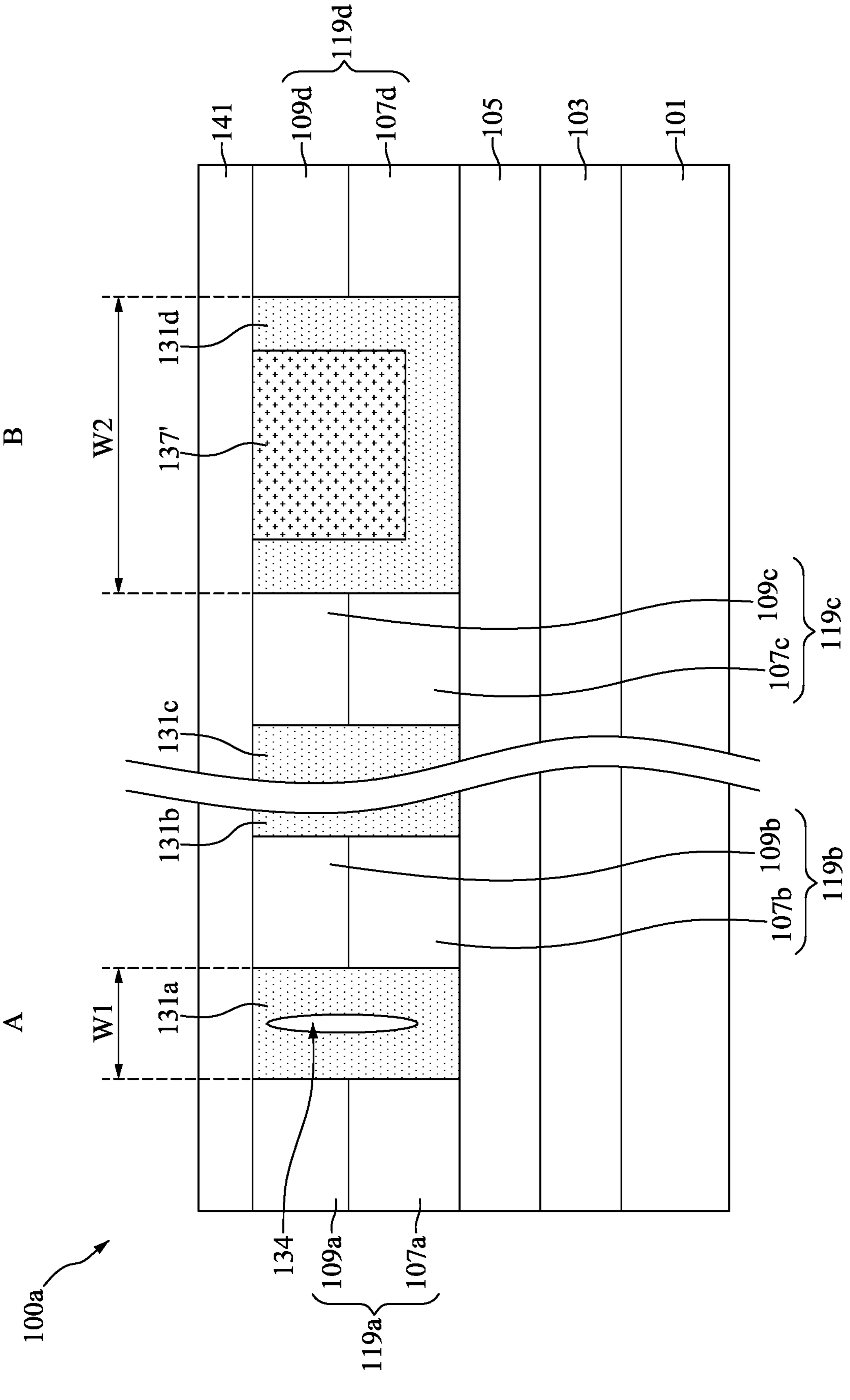
FIG. 1 is a cross-sectional view illustrating a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device structure 100*a*, in accordance with some embodiments. As shown in FIG. 1, the semiconductor device structure 100*a* includes a semiconductor substrate 101, a first dielectric layer 103 disposed over the semiconductor substrate 101, and a second dielectric layer 105 disposed over the first dielectric layer 103, in accordance with some embodiments. In some embodiments, the semiconductor device structure 100*a* also includes a plurality of interconnect structures 119*a*, 119*b*, 119*c*, and 119*d* disposed over the second dielectric layer 105.

In some embodiments, the interconnect structures 119*a*, 119*b*, 119*c*, and 119*d* are separated from each other. Each of the interconnect structures 119*a*, 119*b*, 119*c*, and 119*d* includes a first conductive portion and a second conductive portion disposed over the first conductive portion. For example, the interconnect structure 119*a* includes a first conductive portion 107*a* and a second conductive portion 109*a*, the interconnect structure 119*b* includes a first conductive portion 107*b* and a second conductive portion 109*b*, the interconnect structure 119*c* includes a first conductive portion 107*c* and a second conductive portion 109*c*, and the interconnect structure 119*d* includes a first conductive portion 107*d* and a second conductive portion 109*d*.

In some embodiments, the semiconductor device structure 100*a* includes dielectric liner portions 131*a*, 131*b*, 131*c*, and 131*d* disposed over the second dielectric layer 105. Each of the dielectric liner portions 131*a*, 131*b*, 131*c*, and 131*d* is disposed between two adjacent interconnect structures. In some embodiments, each of the dielectric liner portions 131*a*, 131*b*, 131*c*, and 131*d* is in direct contact with the first conductive portions and the second conductive portions of the two adjacent interconnect structures. In some embodiments, an air gap 134 is enclosed in the dielectric liner portion 131*a*, and a filling portion 137' is surrounded by the dielectric liner portion 131*d*.

In some embodiments, the filling portion 137' is separated from the second dielectric layer 105 by the dielectric liner portion 131*d*. In some embodiments, the filling portion 137' is separated from the two adjacent interconnect structures 119*c* and 119*d* by the dielectric liner portion 131*d*. In addition, the semiconductor device structure 100*a* includes a cover layer 141 disposed over the interconnect structures 119*a*, 119*b*, 119*c*, 119*d*, the dielectric liner portions 131*a*, 131*b*, 131*c*, 131*d*, and the filling portion 137'. In some embodiments, the cover layer 141 is in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 137'.

Moreover, the semiconductor device structure 100*a* has a first region A and a second region B. In some embodiments, the interconnect structures 119*a* and 119*b*, the dielectric liner portions 131*a* and 131*b*, and the air gap 134 are in the first region A. In some embodiments, the interconnect structures 119*c* and 119*d*, the dielectric liner portions 131*c* and 131*d*, and the filling portion 137' are in the second region B.

As shown in FIG. 1, the space between the interconnect structures 119*a* and 119*b* is occupied by the dielectric liner portion 131*a* and the air gap 134, and the space between the interconnect structures 119*c* and 119*d* is occupied by the dielectric liner portion 131*d* and the filling portion 137', in accordance with some embodiments. Since the space occupied by the dielectric liner portion 131*a* and the air gap 134 is smaller than the space occupied by the dielectric liner portion 131*d* and the filling portion 137', the first region A is also referred to as a small gap-fill region, and the second region B is also referred to as a large gap-fill region.

In some embodiments, in the cross-sectional view of FIG. 1, the space occupied by the dielectric liner portion 131*a* and the air gap 134 has a width W1, and the space occupied by the dielectric liner portion 131*d* and the filling portion 137' has a width W2, and the width W2 is greater than the width W1. The width W1 is also referred to as the bottom width of the dielectric liner portion 131*a*, and the width W2 is also referred to as the bottom width of the dielectric liner portion 131*d*. In some embodiments, the bottom width W2 of the dielectric liner portion 131*d* in the large gap-fill region B is greater than the bottom width W1 of the dielectric liner portion 131*a* in the small gap-fill region A.

In FIG. 1, four interconnect structures 119*a*, 119*b*, 119*c*, 119*d* and four dielectric liner portions 131*a*, 131*b*, 131*c*, 131*d* are illustrated. However, the numbers are not limited thereto. In some other embodiments, the numbers of the interconnect structures and the dielectric liner portions may be adjusted based on design requirement. Similarly, in FIG. 1, one air gap 134 is illustrated in the small gap-fill region A, and one filling portion 137' is illustrated in the large gap-fill region B. It should be noted that the numbers are not limited thereto. For example, in some other embodiments, the number of the air gap in the small gap-fill region A and the number of the filling portion in the large gap-fill region B may be adjusted based on design requirement.

Figure 2:
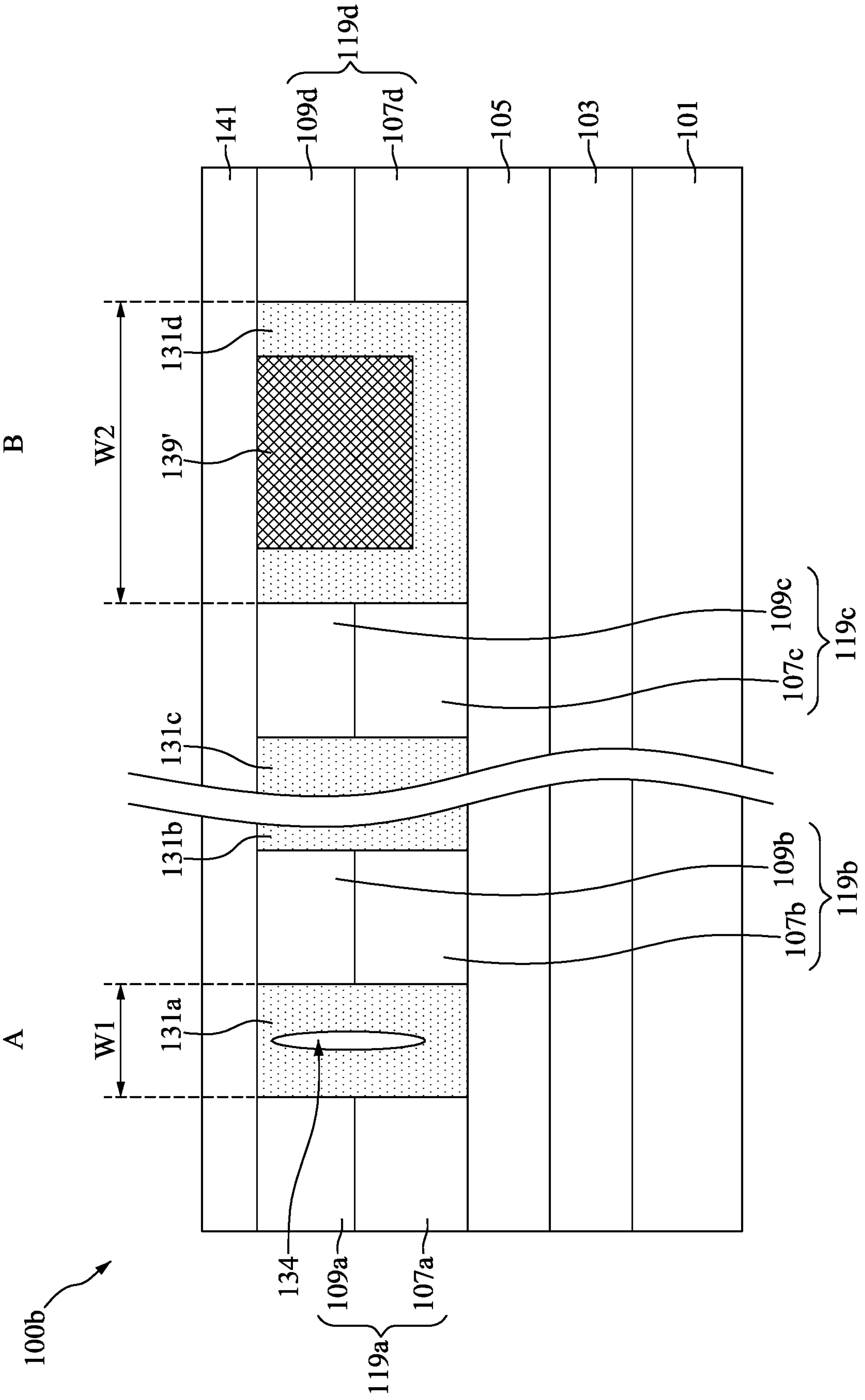
FIG. 2 is a cross-sectional view illustrating a semiconductor device structure, in accordance with some embodiments.

FIG. 2 is a cross-sectional view illustrating a semiconductor device structure 100*b*, in accordance with some embodiments. The semiconductor device structure 100*b* is similar to the semiconductor device structure 100*a*. However, in the semiconductor device structure 100*b*, the filling portion 137' is replaced by another filling portion 139', and the materials of the filling portions 137' and 139' are different, in accordance with some embodiments.

In some embodiments, the filling portion 137' of the semiconductor device structure 100*a* includes a low-k dielectric material, and the filling portion 139' of the semiconductor device structure 100*b* includes an energy removable material. In some embodiments, the filling portion 139' including the energy removable material is surrounded by the dielectric liner portion 131*d*. Details regarding this embodiment that are similar to those for the previously described embodiment will not be repeated herein.

Figure 3:
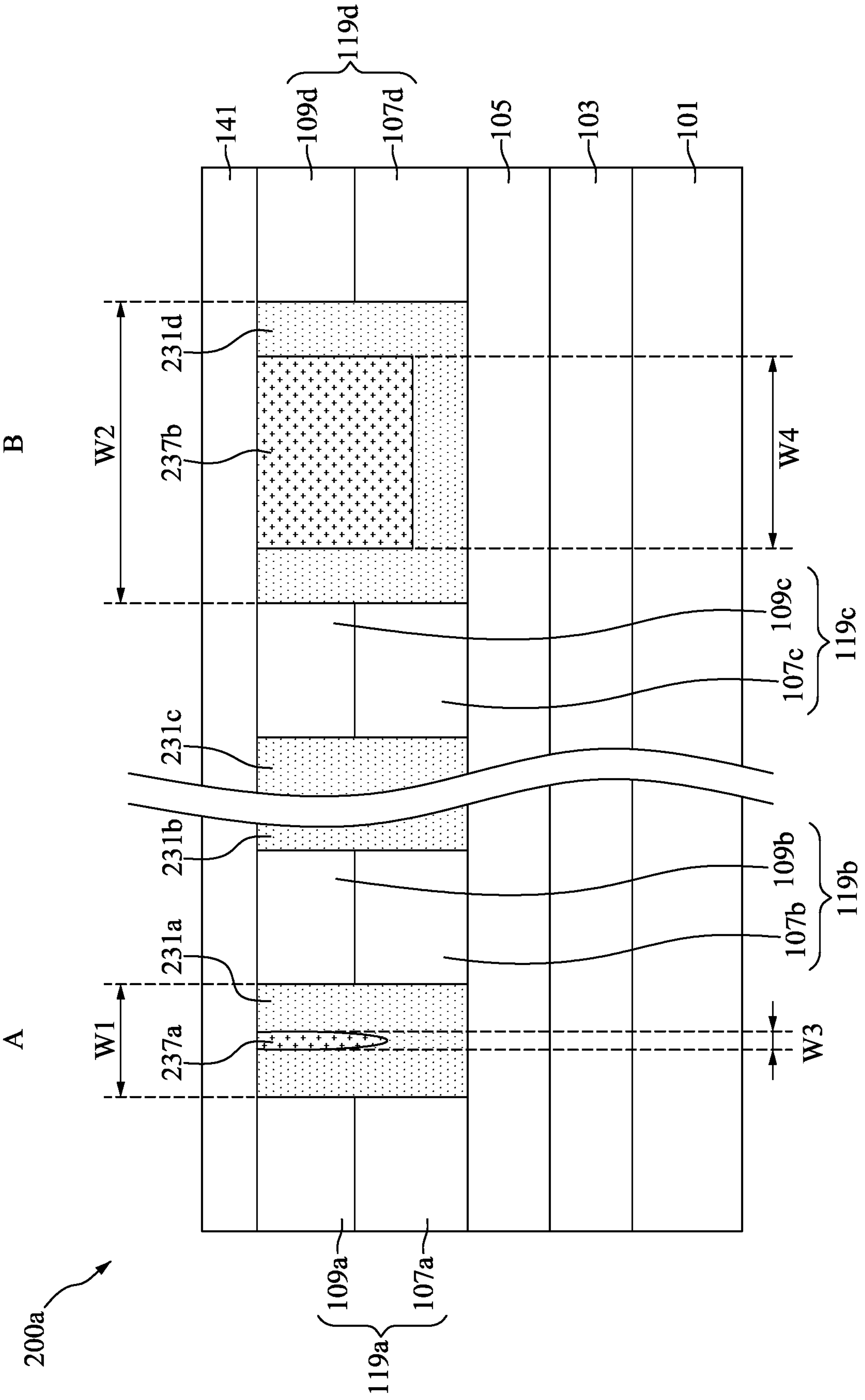
FIG. 3 is a cross-sectional view illustrating a semiconductor device structure, in accordance with some embodiments.

FIG. 3 is a cross-sectional view illustrating a semiconductor device structure 200*a*, in accordance with some embodiments. The semiconductor device structure 200*a* is similar to the semiconductor device structure 100*a*. However, in the semiconductor device structure 200*a*, dielectric liner portions 231*a* and 231*b* are formed in the first region A (i.e., the small gap-fill region), dielectric liner portions 231*c* and 231*d* are formed in the second region B (i.e., the large gap-fill region), a filling portion 237*a* is surrounded by the dielectric liner portion 231*a*, and a filling portion 237*b* is surrounded by the dielectric liner portion 231*d*. In the semiconductor device structure 200*a*, there is no air gap in the dielectric liner portion 231*a* of the first region A.

Similar to the semiconductor device structure 100*a*, the bottom width W2 of the dielectric liner portion 231*d* is greater than the bottom width W1 of the dielectric liner portion 231*a*, in accordance with some embodiments. Moreover, in some embodiments, the materials of the filling portions 237*a* and 237*b* are the same. For example, the filling portions 237*a* and 237*b* include a low-k dielectric material.

In some embodiments, the filling portion 237*a* in the first region A has a width W3, the filling portion 237*b* in the second region B has a width W4, and the width W4 is greater than the width W3. In some embodiments, the cover layer 141 is in direct contact with the top surfaces of the filling portions 237*a* and 237*b*. Details regarding this embodiment that are similar to those for the previously described embodiment will not be repeated herein.

Figure 4:
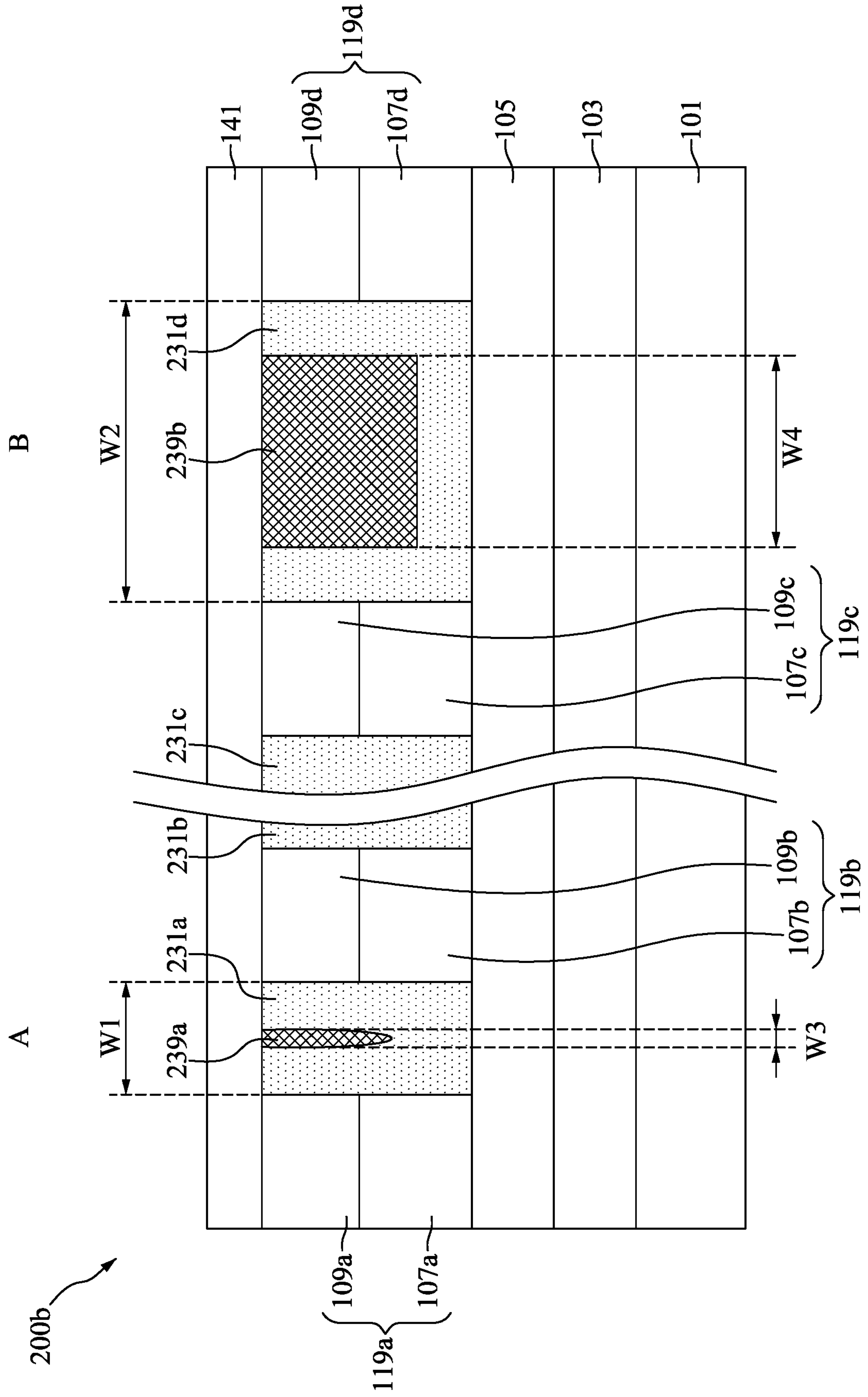
FIG. 4 is a cross-sectional view illustrating a semiconductor device structure, in accordance with some embodiments.

FIG. 4 is a cross-sectional view illustrating a semiconductor device structure 200*b*, in accordance with some embodiments. The semiconductor device structure 200*b* is similar to the semiconductor device structure 200*a*. However, in the semiconductor device structure 200*b*, the filling portions 237*a* and 237*b* are replaced by filling portions 239*a* and 239*b*, respectively. The materials of the filling portions 239*a* and 239*b* are the same, but different from that of the filling portions 237*a* and 237*b* in the semiconductor device structure 200*a*, in accordance with some embodiments.

In some embodiments, the filling portions 237*a* and 237*b* of the semiconductor device structure 200*a* include a low-k dielectric material, and the filling portions 239*a* and 239*b* of the semiconductor device structure 200*b* include an energy removable material. Details regarding this embodiment that are similar to those for the previously described embodiment will not be repeated herein.

Figure 5:
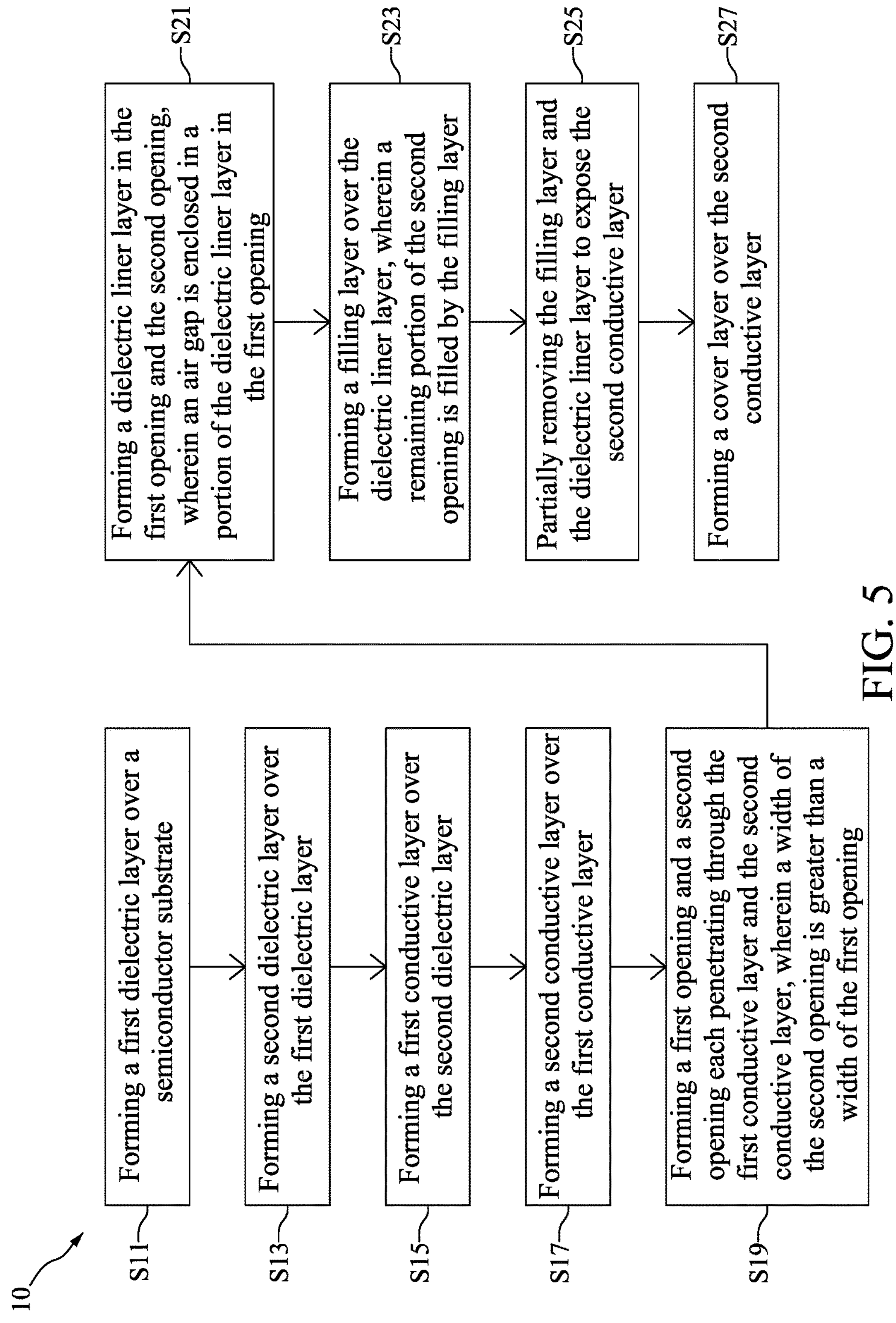
FIG. 5 is a flow diagram illustrating a method for preparing a semiconductor device structure, in accordance with some embodiments.

FIG. 5 is a flow diagram illustrating a method 10 for preparing a semiconductor device structure (e.g., the semiconductor device structure 100*a* or 100*b*), and the method 10 includes steps S11, S13, S15, S17, S19, S21, S23, S25 and S27, in accordance with some embodiments. The steps S11 to S27 of FIG. 5 are elaborated in connection with the following figures, such as FIGS. 7-15.

Figure 6:
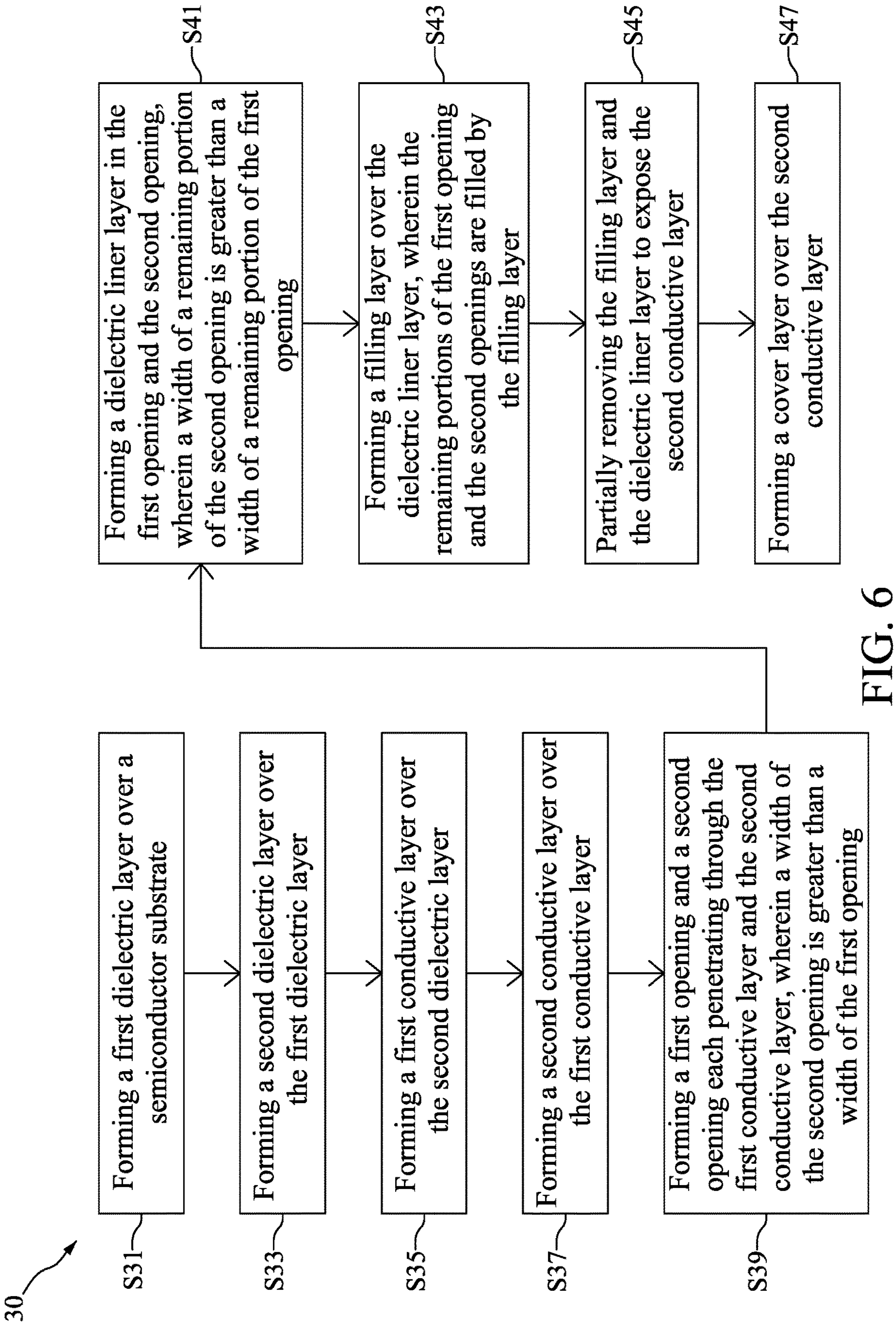
FIG. 6 is a flow diagram illustrating a method for preparing a semiconductor device structure, in accordance with some embodiments.

FIG. 6 is a flow diagram illustrating a method 30 for preparing a semiconductor device structure (e.g., the semiconductor device structure 200*a* or 200*b*), and the method 30 includes steps S31, S33, S35, S37, S39, S41, S43, S45 and S47, in accordance with some embodiments. The steps S31 to S47 of FIG. 6 are elaborated in connection with the following figures, such as FIGS. 16-20.

Figure 7:
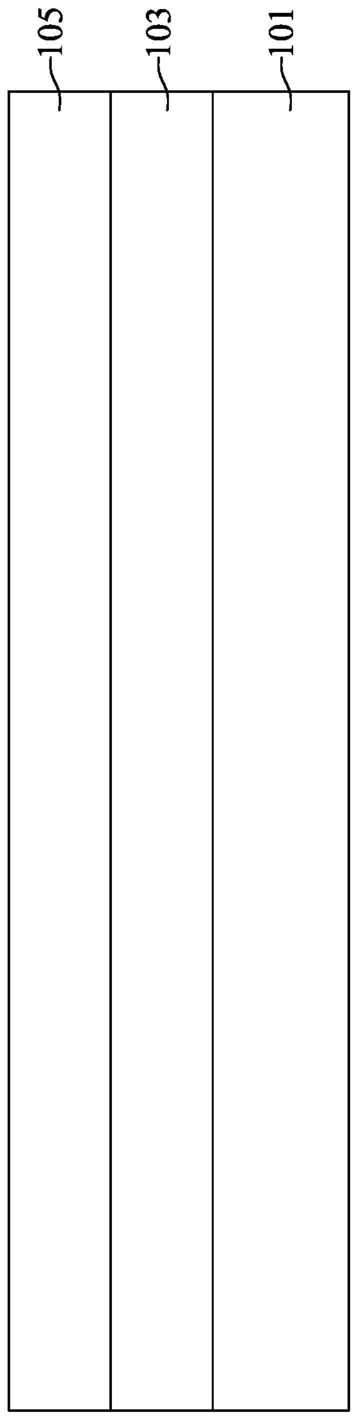
FIG. 7 is a cross-sectional view illustrating an intermediate stage of sequentially forming a first dielectric layer and a second dielectric layer over a semiconductor substrate during the formation of the semiconductor device structure, in accordance with some embodiments.

FIGS. 7-13 are cross-sectional views illustrating intermediate stages of forming the semiconductor device structure 100*a*, in accordance with some embodiments. As shown in FIG. 7, a semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A first dielectric layer 103 and a second dielectric layer 105 are sequentially formed over the semiconductor substrate 101, as shown in FIG. 7 in accordance with some embodiments. The respective steps are illustrated as the steps S11 and S13 in the method 10 shown in FIG. 5. In some embodiments, the first dielectric layer 103 and the second dielectric layer 105 are made of or include silicon oxide, silicon nitride, or silicon oxynitride. In some embodiments, the first dielectric layer 103 is made of or includes borosilicate glass (BSG), silicon dioxide ($SiO_2$), or a combination thereof. In some embodiments, the second dielectric layer 105 is made of or includes borophosphosilicate glass (BPSG), tetraethoxysilane (TEOS), or a combination thereof.

The first dielectric layer 103 may be formed by a deposition process, such as a chemical vapor deposition (CVD) process, a physical vapor deposition (PVD) process, an atomic layer deposition (ALD) process, a spin-on coating process, or another suitable method. Some processes used to form the second dielectric layer 105 are similar to, or the same as, those used to form the first dielectric layer 103, and details thereof are not repeated herein. In addition, the second dielectric layer 105 may also be referred to as an interlayer dielectric (ILD) layer.

Figure 8:
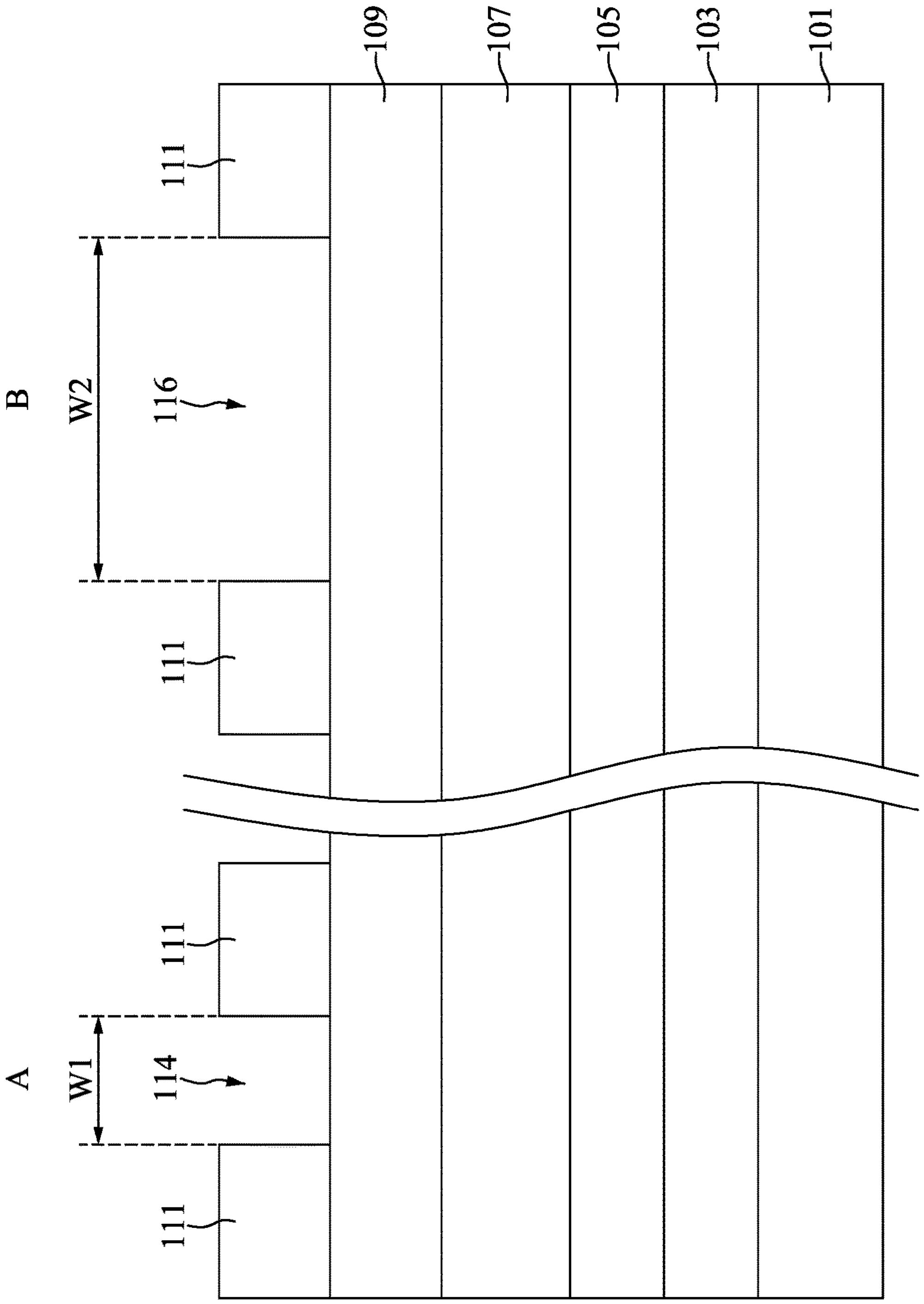
FIG. 8 is a cross-sectional view illustrating an intermediate stage of sequentially forming a first conductive layer, a second conductive layer, and a patterned mask over the second dielectric layer during the formation of the semiconductor device structure, in accordance with some embodiments.

Next, a first conductive layer 107 and a second conductive layer 109 are sequentially formed over the second dielectric layer 105, as shown in FIG. 8 in accordance with some embodiments. The respective steps are illustrated as the steps S15 and S17 in the method 10 shown in FIG. 5. In some embodiments, the first conductive layer 107 and the second conductive layer 109 are made of or include tungsten (W), aluminum (Al), copper (Cu), titanium (Ti), tantalum (Ta), titanium nitride (TiN), tantalum nitride (TaN), cobalt tungsten (CoW), another suitable material, or a combination thereof. In some embodiments, the first conductive layer 107 is made of or includes titanium nitride (TiN), and the second conductive layer 109 is made of or includes tungsten (W).

The first conductive layer 107 may be formed by a deposition process, such as a CVD process, a PVD process, an ALD process, a metal organic chemical vapor deposition (MOCVD) process, a sputtering process, a plating process, or another suitable method. Some processes used to form the second conductive layer 109 are similar to, or the same as, those used to form the first conductive layer 107, and details thereof are not repeated herein. In addition, the first conductive layer 107 may also be referred to as a barrier layer.

Still referring to FIG. 8, a patterned mask 111 with a plurality of openings (e.g., the openings 114 and 116) is formed over the second conductive layer 109, in accordance with some embodiments. In some embodiments, the opening 114 is in the first region A, the opening 116 is in the second region B, and the second conductive layer 109 are partially exposed by the openings 114 and 116. In some embodiments, the width of the opening 116 (i.e., the width W2) is greater than the width of the opening 114 (i.e., the width W1). In some embodiments, the second conductive layer 109 and the patterned mask 111 include different materials so that the etching selectivities may be different in the subsequent etching process.

Figure 9:
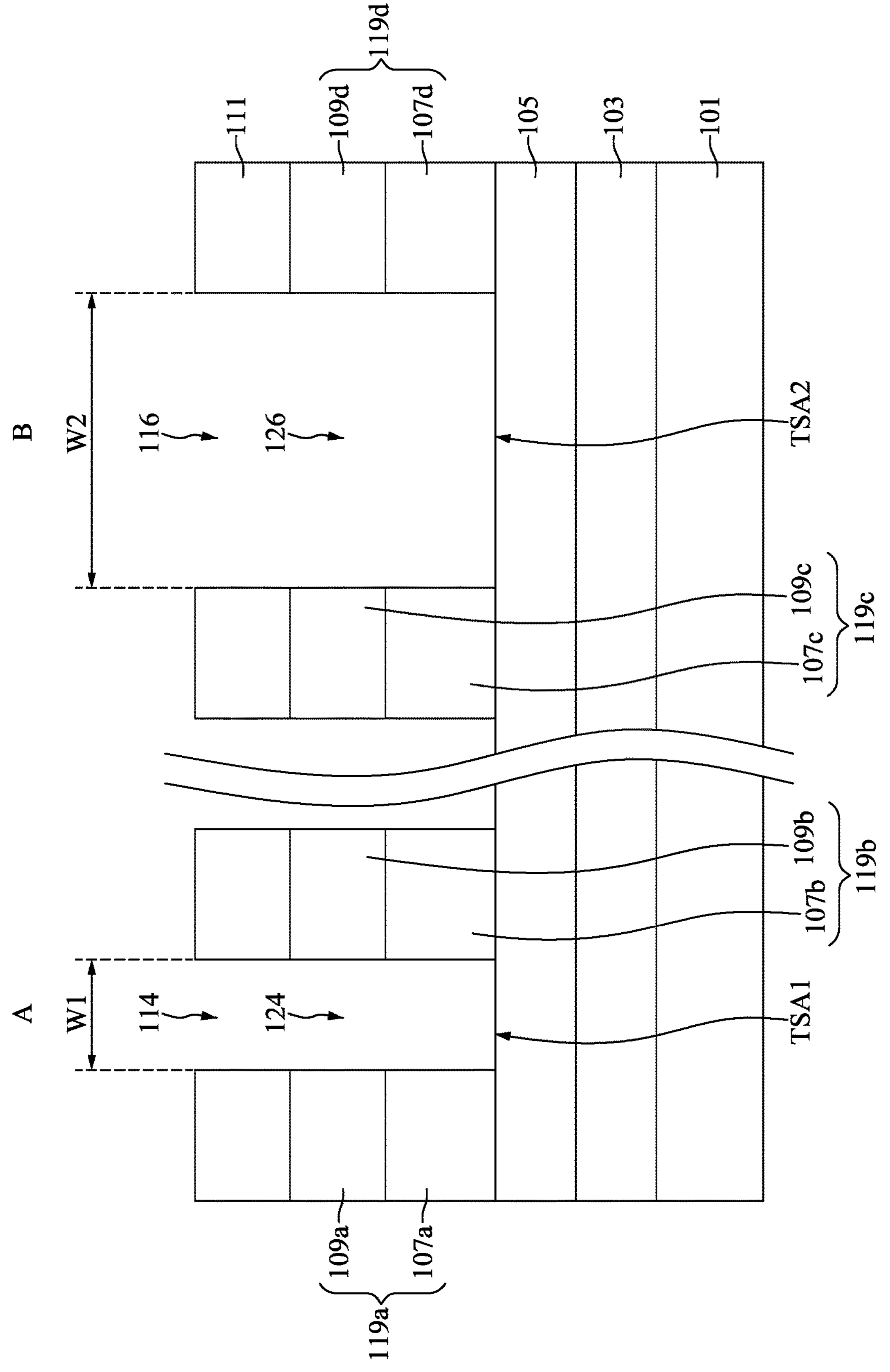
FIG. 9 is a cross-sectional view illustrating an intermediate stage of forming a first opening and a second opening penetrating through the first conductive layer and the second conductive layer using the patterned mask as an etching mask during the formation of the semiconductor device structure, in accordance with some embodiments.

Subsequently, an etching process is performed using the patterned mask 111 as an etching mask, such that openings 124 and 126 are formed penetrating through the first conductive layer 107 and the second conductive layer 109, as shown in FIG. 9 in accordance with some embodiments. In some embodiments, a width of the opening 126 (i.e., the width W2) in the second region B is greater than a width of the opening 124 (i.e., the width W1) in the first region A. The respective step is illustrated as the step S19 in the method 10 shown in FIG. 5.

Moreover, a top surface area TSA2 of the second dielectric layer 105 exposed by the opening 126 is greater than a top surface area TSA1 of the second dielectric layer 105 exposed by the opening 124, in accordance with some embodiments. In some embodiments, the etching process for forming the openings 124 and 126 includes a wet etching process, a dry etching process, or a combination thereof.

After the openings 124 and 126 are formed, a plurality of interconnect structures 119*a*, 119*b*, 119*c*, and 119*d* are obtained. In some embodiments, the remaining portions of the first conductive layer 107 and the second conductive layer 109 are referred to as first conductive portions 107*a*, 107*b*, 107*c*, 107*d* and second conductive portions 109*a*, 109*b*, 109*c*, 109*d* hereinafter. As mentioned above, each of the interconnect structures 119*a*, 119*b*, 119*c*, and 119*d* includes a first conductive portion and a second conductive portion disposed over the first conductive portion, as shown in FIG. 9 in accordance with some embodiments.

Figure 10:
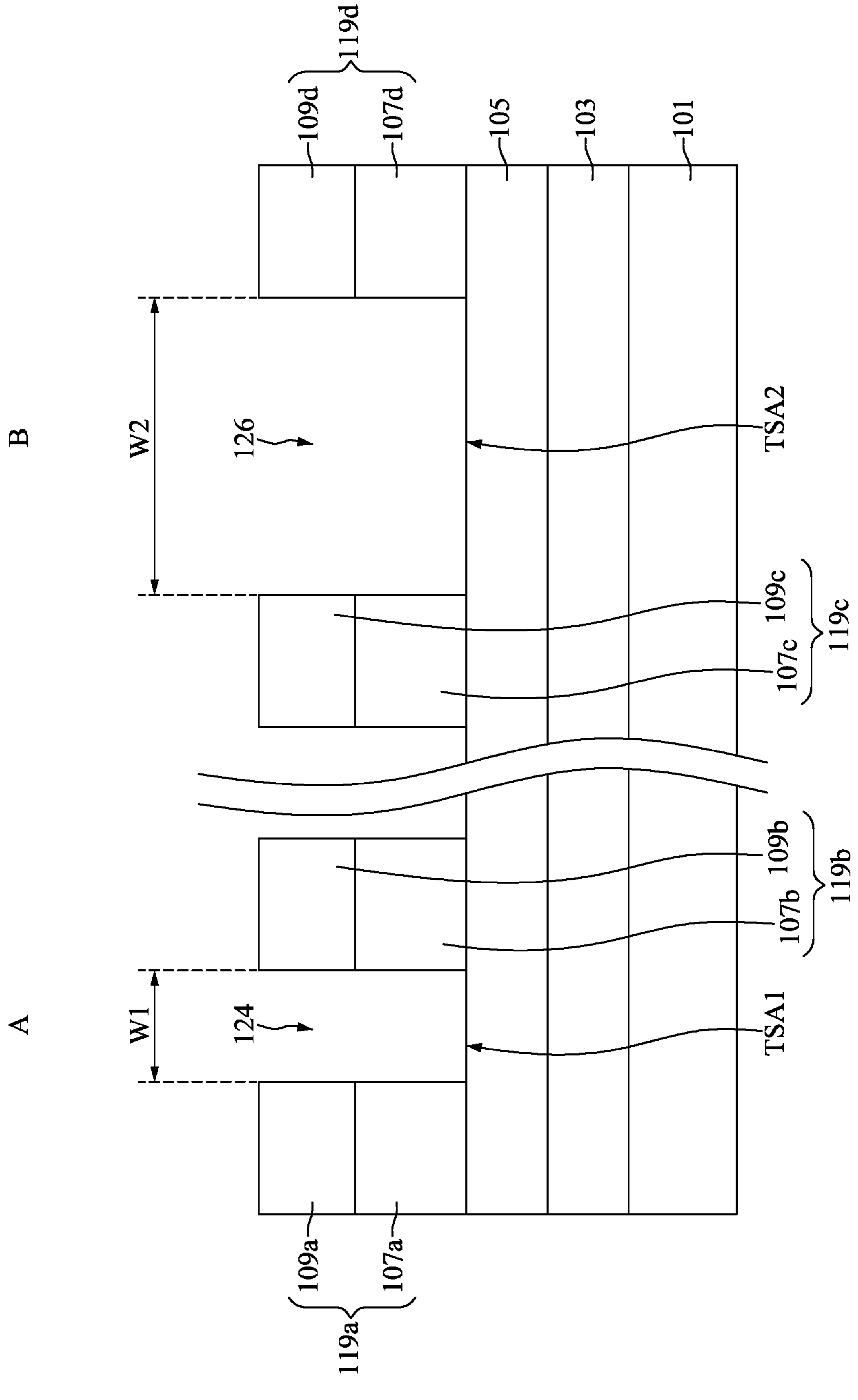
FIG. 10 is a cross-sectional view illustrating an intermediate stage of removing the patterned mask during the formation of the semiconductor device structure, in accordance with some embodiments.

Then, the patterned mask 111 is removed, as shown in FIG. 10 in accordance with some embodiments. In some embodiments, the patterned mask 111 is removed by a stripping process, an ashing process, an etching process, or another suitable process. After the patterned mask 111 is removed, the top surfaces of the second conductive portions 109*a*, 109*b*, 109*c* and 109*d* are exposed.

Figure 11:
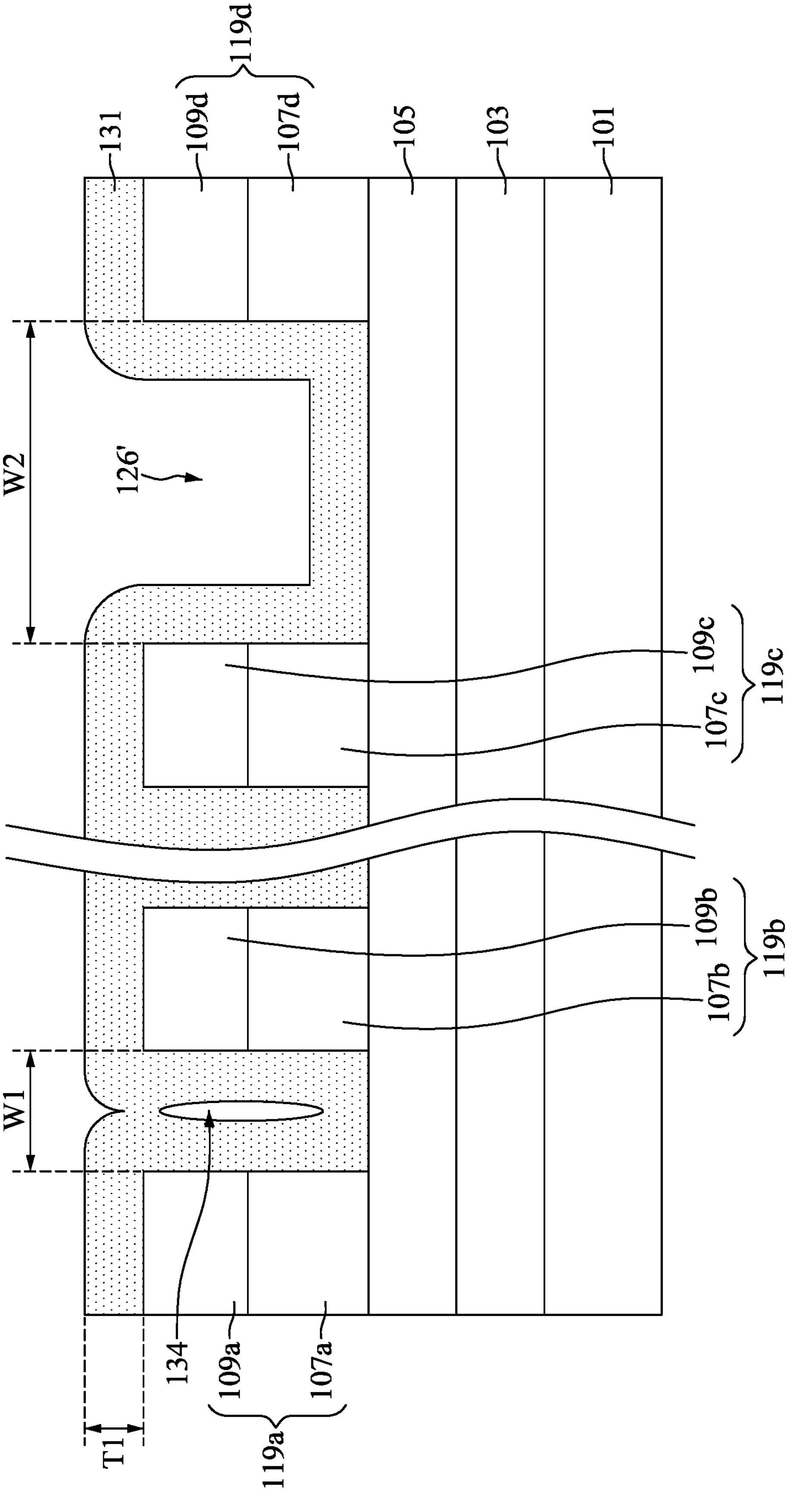
FIG. 11 is a cross-sectional view illustrating an intermediate stage of forming a dielectric liner layer in the first opening and the second opening during the formation of the semiconductor device structure, in accordance with some embodiments.

Next, a dielectric liner layer 131 is conformally formed over the structure of FIG. 10, as shown in FIG. 11 in accordance with some embodiments. In some embodiments, the dielectric liner layer 131 is formed in the openings 124 and 126 and over the top surfaces of the second conductive portions 109*a*, 109*b*, 109*c* and 109*d*. The respective step is illustrated as the step S21 in the method 10 shown in FIG. 5.

In some embodiments, the thickness of the dielectric liner layer 131 is adjusted such that an air gap 134 is enclosed in the portion of the dielectric liner layer 131 filled in the opening 124, while the opening 126 remains unfilled by the dielectric liner layer 131. In some embodiments, the dielectric liner layer 131 has a thickness T1, the width W1 of the opening 124 is less than two times of the thickness T1, and the width W2 of the opening 126 is greater than two times of the thickness T1.

Moreover, in some embodiments, the dielectric liner layer 131 is made of or includes boron carbonitride (BCN). However, any other suitable dielectric materials may be utilized. The dielectric liner layer 131 may be formed by a deposition process, such as a CVD process, a PVD process, an ALD process, a spin-on coating process, or another suitable method. In some embodiments, the air gap 134 is enclosed (or sealed) in the portion of the dielectric liner layer 131 filled in the opening 124. In other words, the air gap 134 is not exposed.

Figure 12:
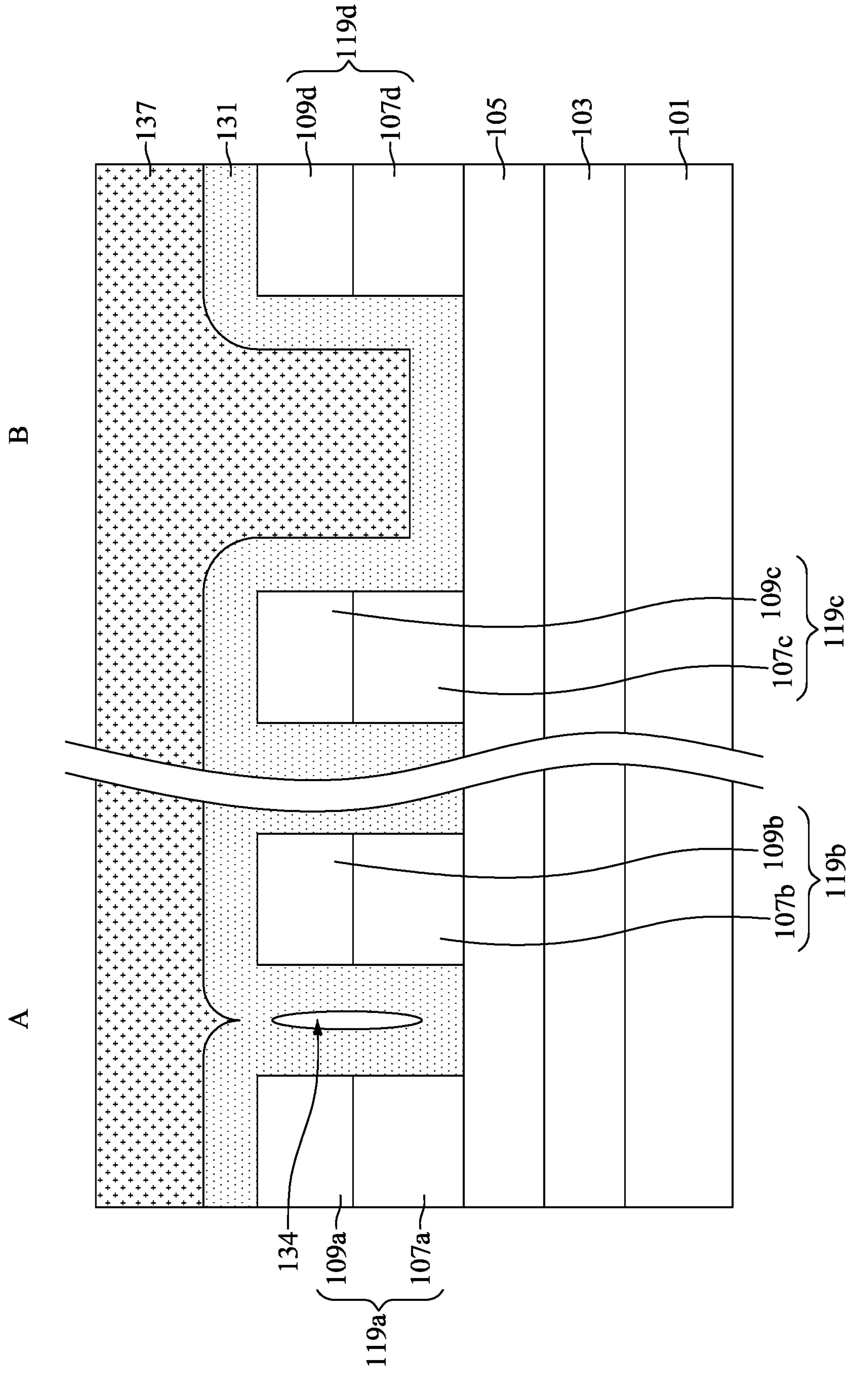
FIG. 12 is a cross-sectional view illustrating an intermediate stage of forming a filling layer over the dielectric liner layer during the formation of the semiconductor device structure, in accordance with some embodiments.

Subsequently, a filling layer 137 is formed over the dielectric liner layer 131, as shown in FIG. 12 in accordance with some embodiments. In some embodiments, a remaining portion of the opening 126 (also referred to as 126') in the structure of FIG. 11 is filled by the filling layer 137. The respective step is illustrated as the step S23 in the method 10 shown in FIG. 5.

In some embodiments, since the air gap 134 in the first region A is enclosed by the dielectric liner layer 131, the air gap 134 is separated from the filling layer 137 by the dielectric liner layer 131. In some embodiments, the filling layer 137 is made of or includes a low-k dielectric material. The dielectric constant (k value) of the low-k dielectric material may be lower than about 3.0, for example. In some embodiments, the filling layer 137 is formed by a sputtering process. However, any other suitable deposition methods may be utilized.

Figure 13:
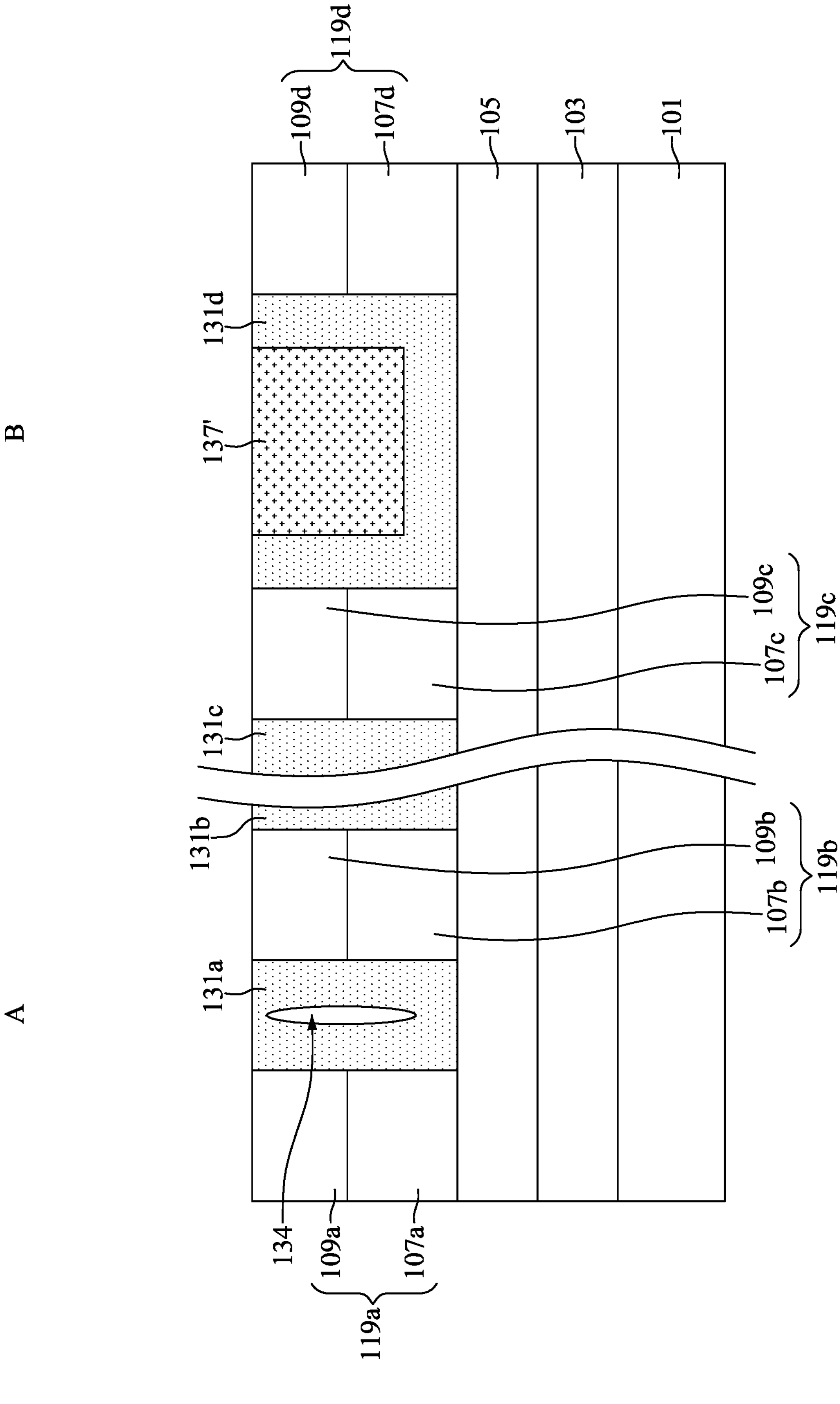
FIG. 13 is a cross-sectional view illustrating an intermediate stage of partially removing the filling layer and the dielectric liner layer to expose the second conductive layer during the formation of the semiconductor device structure, in accordance with some embodiments.

Then, the filling layer 137 and the dielectric liner layer 131 are partially removed to expose the interconnect structures 119*a*, 119*b*, 119*c* and 119*d* (i.e., the second conductive portions 109*a*, 109*b*, 109*c* and 109*d*), as shown in FIG. 13 in accordance with some embodiments. The respective step is illustrated as the step S25 in the method 10 shown in FIG. 5. After the filling layer 137 and the dielectric liner layer 131 are partially removed, dielectric liner portions 131*a*, 131*b*, 131*c*, 131*d* and a filling portion 137' are obtained.

In some embodiments, the dielectric liner portions 131*a*, 131*b* and the air gap 134 are in the first region A, and the dielectric liner portions 131*c*, 131*d*, and the filling portion 137' are in the second region B. In some embodiments, the filling layer 137 and the dielectric liner layer 131 are partially removed by a planarization process, an etch-back process, or a combination thereof. The planarization process may include a chemical mechanical polishing (CMP) process.

Next, a cover layer 141 is formed over the interconnect structures 119*a*, 119*b*, 119*c*, and 119*d*, as shown in FIG. 1 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 137'. The respective step is illustrated as the step S27 in the method 10 shown in FIG. 5.

In some embodiments, the cover layer 141 is made of or includes a silicon-based material, such as silicon nitride ($Si_3N_4$), silicon oxynitride (SiON), or silicon dioxide ($SiO_2$). In some embodiments, the cover layer 141 is made of or includes carbonitride with or without an additional dopant such as boron (B). The cover layer 141 may be formed by a deposition process, such as a CVD process, a PVD process, an ALD process, a spin-on coating process, or another suitable method. After the cover layer 141 is formed, the semiconductor device structure 100*a* is obtained.

Figure 14:
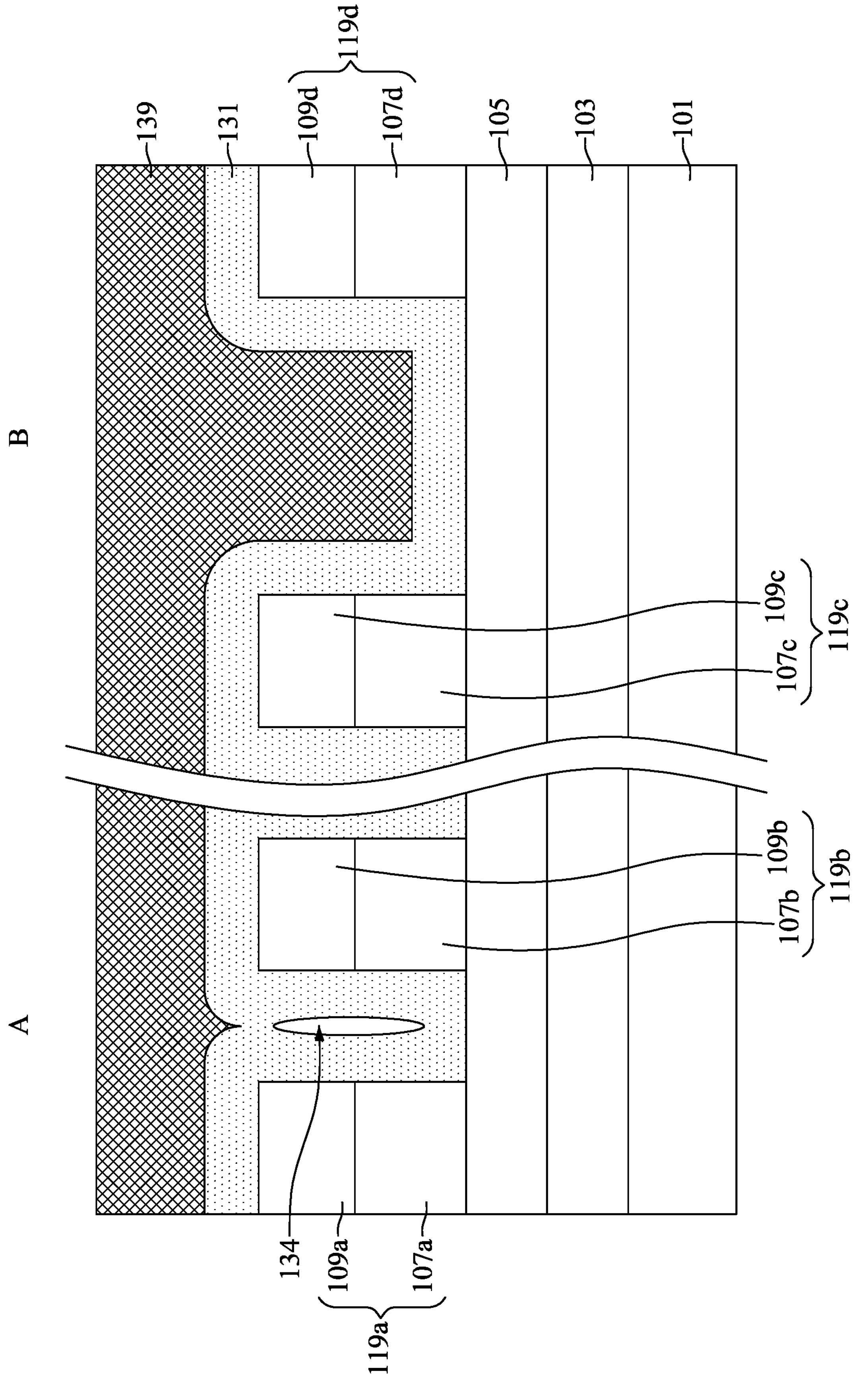
FIG. 14 is a cross-sectional view illustrating an intermediate stage of forming a filling layer over the dielectric liner layer during the formation of the semiconductor device structure, in accordance with some embodiments.
Figure 15:
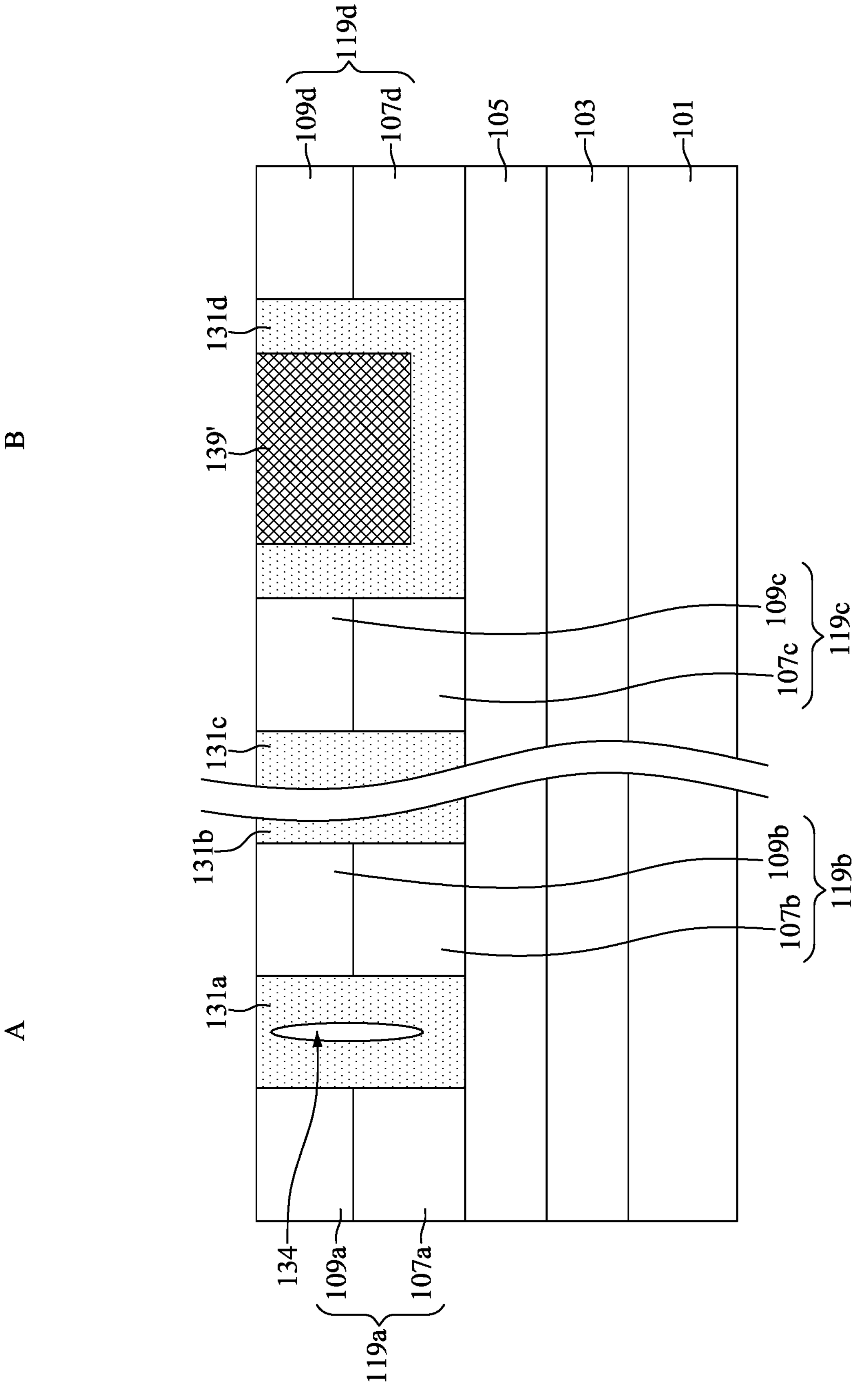
FIG. 15 is a cross-sectional view illustrating an intermediate stage of partially removing the filling layer and the dielectric liner layer to expose the second conductive layer during the formation of the semiconductor device structure, in accordance with some embodiments.

FIGS. 14 and 15 are cross-sectional views illustrating intermediate stages of forming the semiconductor device structure 100*b*, in accordance with some embodiments. It should be pointed out that operations for forming the semiconductor device structure 100*b* before the structure shown in FIG. 14 are substantially the same as the operations for forming the semiconductor device structure 100*a* shown in FIGS. 7-11, and the related detailed descriptions may refer to the foregoing paragraphs and are not discussed again herein.

After the dielectric liner layer 131 is formed, a filling layer 139 is formed over the dielectric liner layer 131, as shown in FIG. 14 in accordance with some embodiments. In some embodiments, a remaining portion of the opening 126 (i.e., 126' in FIG. 11) is filled by the filling layer 139. The respective step is illustrated as the step S23 in the method 10 shown in FIG. 5.

In some embodiments, since the air gap 134 in the first region A is enclosed by the dielectric liner layer 131, the air gap 134 is separated from the filling layer 139 by the dielectric liner layer 131. In some embodiments, the filling layer 139 is made of or includes an energy removable material. In some embodiments, the energy removable material includes a thermal decomposable material. In some other embodiments, the energy removable material includes a photonic decomposable material, an e-beam decomposable material, or another suitable energy decomposable material. In some embodiments, the energy removable material includes a base material and a decomposable porogen material that is substantially removed once being exposed to an energy source (e.g., heat).

In this case, the base material may include hydrogen silsesquioxane (HSQ), methylsilsesquioxane (MSQ), porous polyarylether (PAE), porous SiLK, or porous silicon dioxide ($SiO_2$), and the decomposable porogen material may include a porogen organic compound, which can provide porosity to the space originally occupied by the energy removable material (i.e., the filling layer 139) in the subsequent processes. In some embodiments, the filling layer 139 is formed by a sputtering process. However, any other suitable deposition methods may be utilized.

Subsequently, the filling layer 139 and the dielectric liner layer 131 are partially removed to expose the interconnect structures 119*a*, 119*b*, 119*c* and 119*d* (i.e., the second conductive portions 109*a*, 109*b*, 109*c* and 109*d*), as shown in FIG. 15 in accordance with some embodiments. The respective step is illustrated as the step S25 in the method 10 shown in FIG. 5. After the filling layer 139 and the dielectric liner layer 131 are partially removed, dielectric liner portions 131*a*, 131*b*, 131*c*, 131*d* and a filling portion 139' are obtained.

In some embodiments, the dielectric liner portions 131*a*, 131*b* and the air gap 134 are in the first region A, and the dielectric liner portions 131*c*, 131*d*, and the filling portion 139' are in the second region B. In some embodiments, the filling layer 139 and the dielectric liner layer 131 are partially removed by a planarization process, an etch-back process, or a combination thereof. The planarization process may include a CMP process.

Then, a cover layer 141 is formed over the interconnect structures 119*a*, 119*b*, 119*c*, and 119*d*, as shown in FIG. 2 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 131*a*, 131*b*, 131*c*, 131*d*, and the top surface of the filling portion 139'. The respective step is illustrated as the step S27 in the method 10 shown in FIG. 5.

The details of the cover layer 141 may be essentially the same as what are shown and discussed in FIG. 1, and hence are not repeated herein. After the cover layer 141 is formed, the semiconductor device structure **100*b* is obtained. In some embodiments, a heat treatment process can be performed to transform the filling portion 139' into an air gap (not shown). In some embodiments, the heat treatment process is optional. In some embodiments, the temperature used in the heat treatment process may be high enough to efficiently burn-out the filling portion 139', leaving the air gap enclosed by the dielectric liner portion 131*d* and the cover layer 141. In some other embodiments, the temperature used in the heat treatment process is selected such that the filling portion 139' is transformed into an air gap surrounded or enclosed by a remaining portion of the filling portion 139'**.

Figure 16:
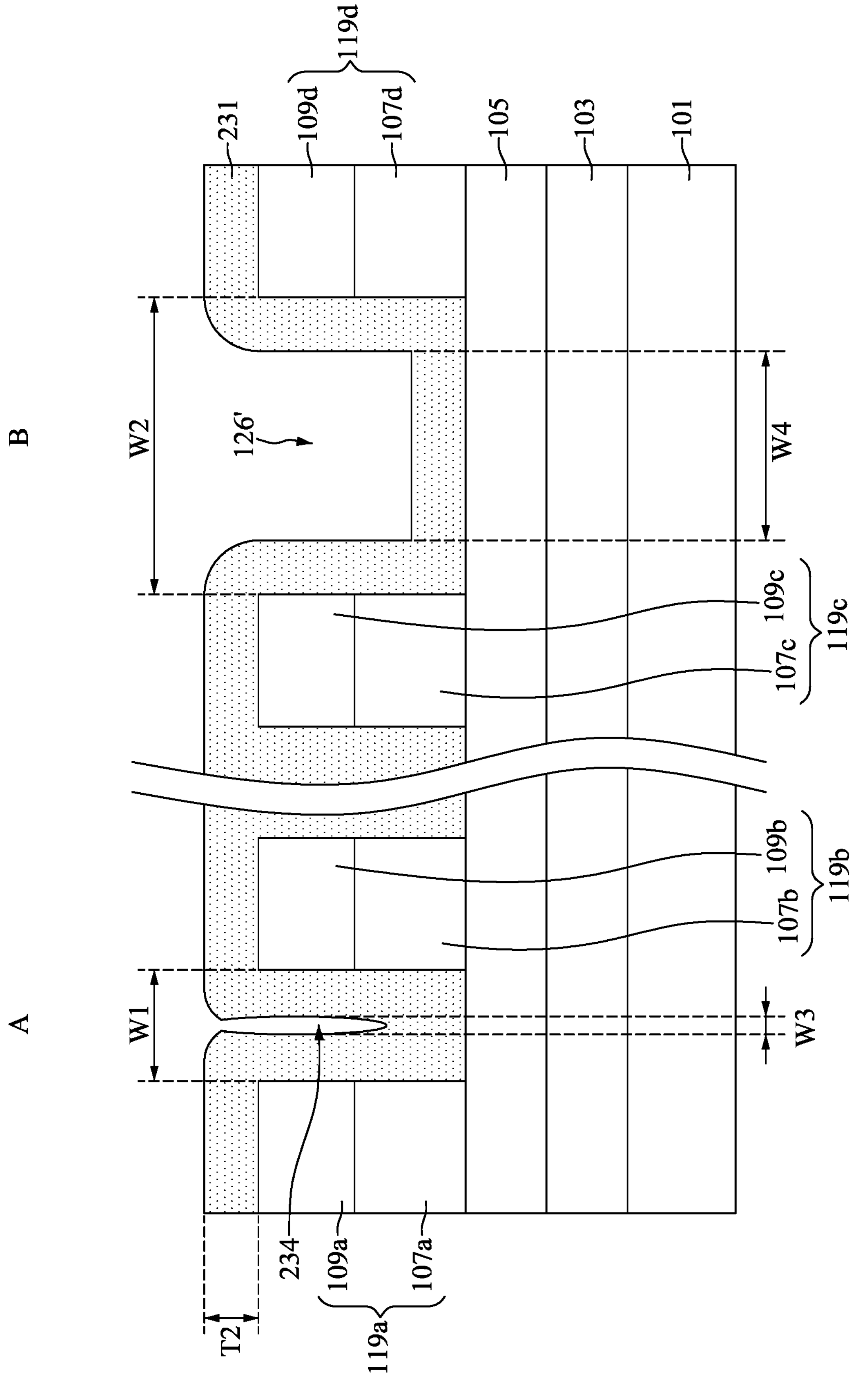
FIG. 16 is a cross-sectional view illustrating an intermediate stage of forming a dielectric liner layer in the first opening and the second opening during the formation of the semiconductor device structure, in accordance with some embodiments.
Figure 17:
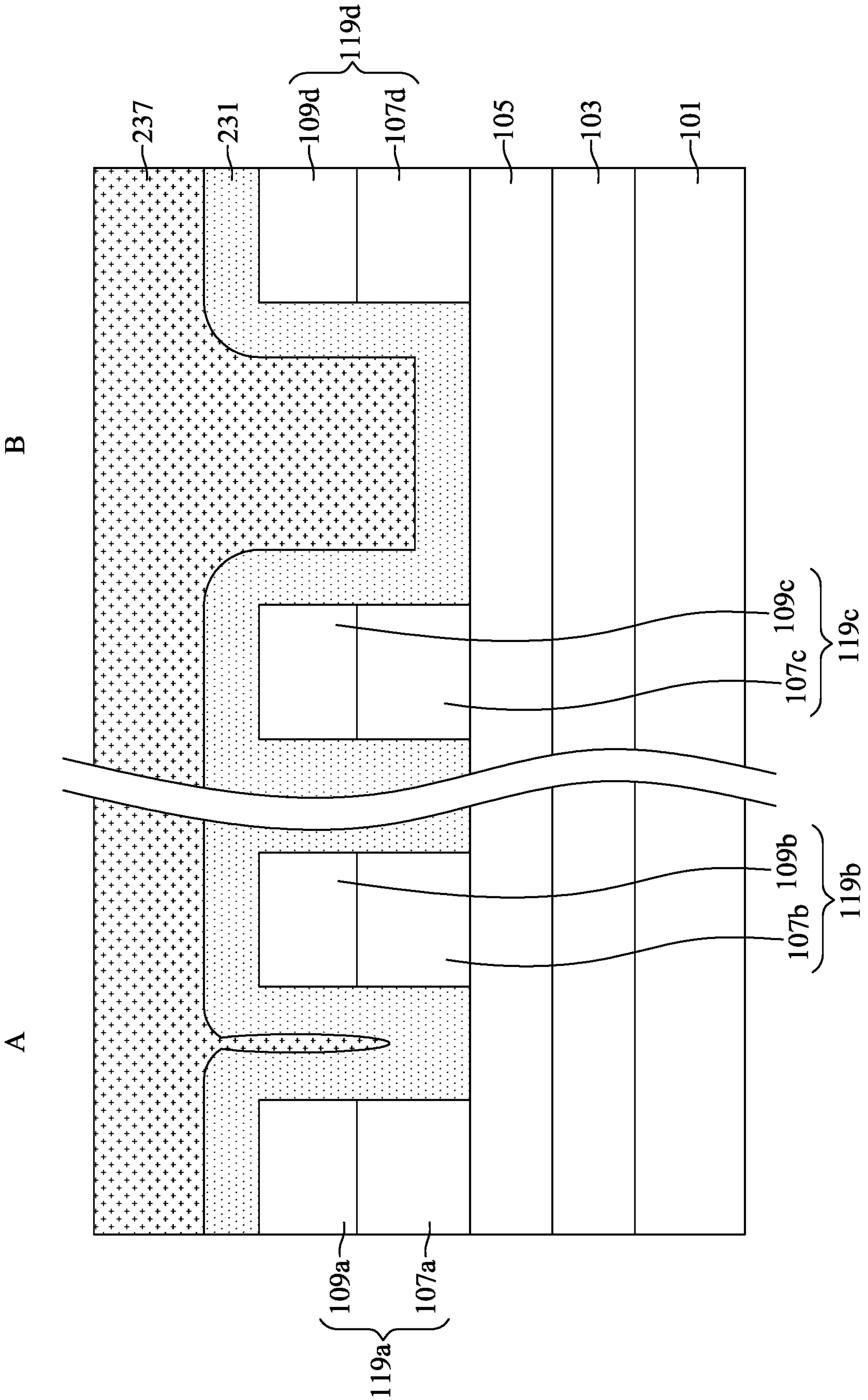
FIG. 17 is a cross-sectional view illustrating an intermediate stage of forming a filling layer over the dielectric liner layer during the formation of the semiconductor device structure, in accordance with some embodiments.
Figure 18:
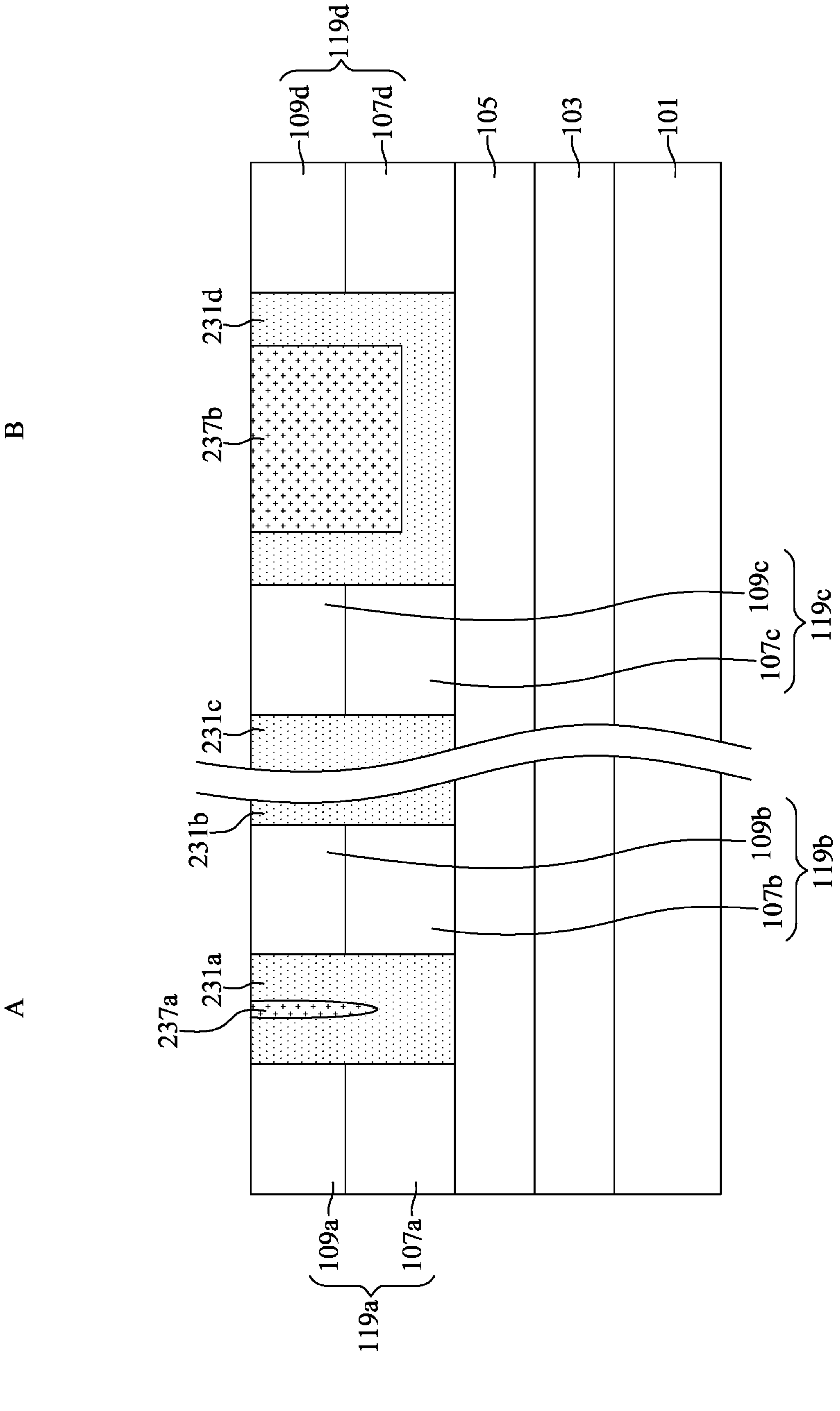
FIG. 18 is a cross-sectional view illustrating an intermediate stage of partially removing the filling layer and the dielectric liner layer to expose the second conductive layer during the formation of the semiconductor device structure, in accordance with some embodiments.

FIGS. 16-18 are cross-sectional views illustrating intermediate stages of forming the semiconductor device structure **200*a*, in accordance with some embodiments. It should be pointed out that operations for forming the semiconductor device structure 200*a* before the structure shown in FIG. 16 are substantially the same as the operations for forming the semiconductor device structure 100*a* shown in FIGS. 7-10 (The steps S31 to S39 in the method 30 shown in FIG. 6 are the same as the steps S11 to S19 in the method 10 shown in FIG. 5**), and the related detailed descriptions may refer to the foregoing paragraphs and are not discussed again herein.

After the openings 124 and 126 are formed, a dielectric liner layer 231 is conformally formed over the structure of FIG. 10, as shown in FIG. 16 in accordance with some embodiments. In some embodiments, the dielectric liner layer 231 is formed in the openings 124 and 126 and over the top surfaces of the second conductive portions **109*a*, 109*b*, 109*c* and 109*d*. The respective step is illustrated as the step S41 in the method 30 shown in FIG. 6**.

In some embodiments, the thickness of the dielectric liner layer 231 is adjusted such that a gap 234 (i.e., the remaining portion of the opening 124) formed in the first region A has a smaller width than that of the opening 126' (i.e., the remaining portion of the opening 126) formed in the second region B. For example, the width W4 of the opening 126' is greater than the width W3 of the gap 234.

Moreover, referring to FIGS. 10 and 16, the dielectric liner layer 231 has a thickness T2, the width W1 of the opening 124 is less than two times of the thickness T2, and the width W2 of the opening 126 is greater than two times of the thickness T2. In some embodiments, the opening 124 in the first region A is partially filled by the dielectric liner layer 231, and there is no air gap enclosed in the dielectric liner layer 231. Some materials and processes used to form the dielectric liner layer 231 are similar to, or the same as, those used to form the dielectric liner layer 131, and details thereof are not repeated herein.

Next, a filling layer 237 is formed over the dielectric liner layer 231, as shown in FIG. 17 in accordance with some embodiments. In some embodiments, the gap 234 (i.e., the remaining portion of the opening 124 after the dielectric liner layer 231 is formed) in the first region A and the opening 126' (i.e., the remaining portion of the opening 126 after the dielectric liner layer 231 is formed) in the second region B are filled by the filling layer 237. The respective step is illustrated as the step S43 in the method 30 shown in FIG. 6.

In some embodiments, the filling layer 237 is made of or includes a low-k dielectric material. The dielectric constant (k value) of the low-k dielectric material may be lower than about 3.0, for example. In some embodiments, the filling layer 237 is formed by a sputtering process. However, any other suitable deposition methods may be utilized.

Subsequently, the filling layer 237 and the dielectric liner layer 231 are partially removed to expose the interconnect structures **119*a*, 119*b*, 119*c* and 119*d* (i.e., the second conductive portions 109*a*, 109*b*, 109*c* and 109*d*), as shown in FIG. 18 in accordance with some embodiments. The respective step is illustrated as the step S45 in the method 30 shown in FIG. 6. After the filling layer 237 and the dielectric liner layer 231 are partially removed, dielectric liner portions 231*a*, 231*b*, 231*c*, 231*d* and filling portions 237*a* and 237*b*** are obtained.

In some embodiments, the dielectric liner portions **231*a*, 231*b* and the filling portion 237*a* are in the first region A, and the dielectric liner portions 231*c*, 231*d*, and the filling portion 237*b* are in the second region B. In some embodiments, the filling layer 237 and the dielectric liner layer 231** are partially removed by a planarization process, an etch-back process, or a combination thereof. The planarization process may include a CMP process.

Then, a cover layer 141 is formed over the interconnect structures **119*a*, 119*b*, 119*c*, and 119*d*, as shown in FIG. 3 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 231*a*, 231*b*, 231*c*, 231*d*, and the top surfaces of the filling portions 237*a* and 237*b*. The respective step is illustrated as the step S47 in the method 30 shown in FIG. 6**.

The details of the cover layer 141 may be essentially the same as what are shown and discussed in FIG. 1, and hence are not repeated herein. After the cover layer 141 is formed, the semiconductor device structure **200*a*** is obtained.

Figure 19:
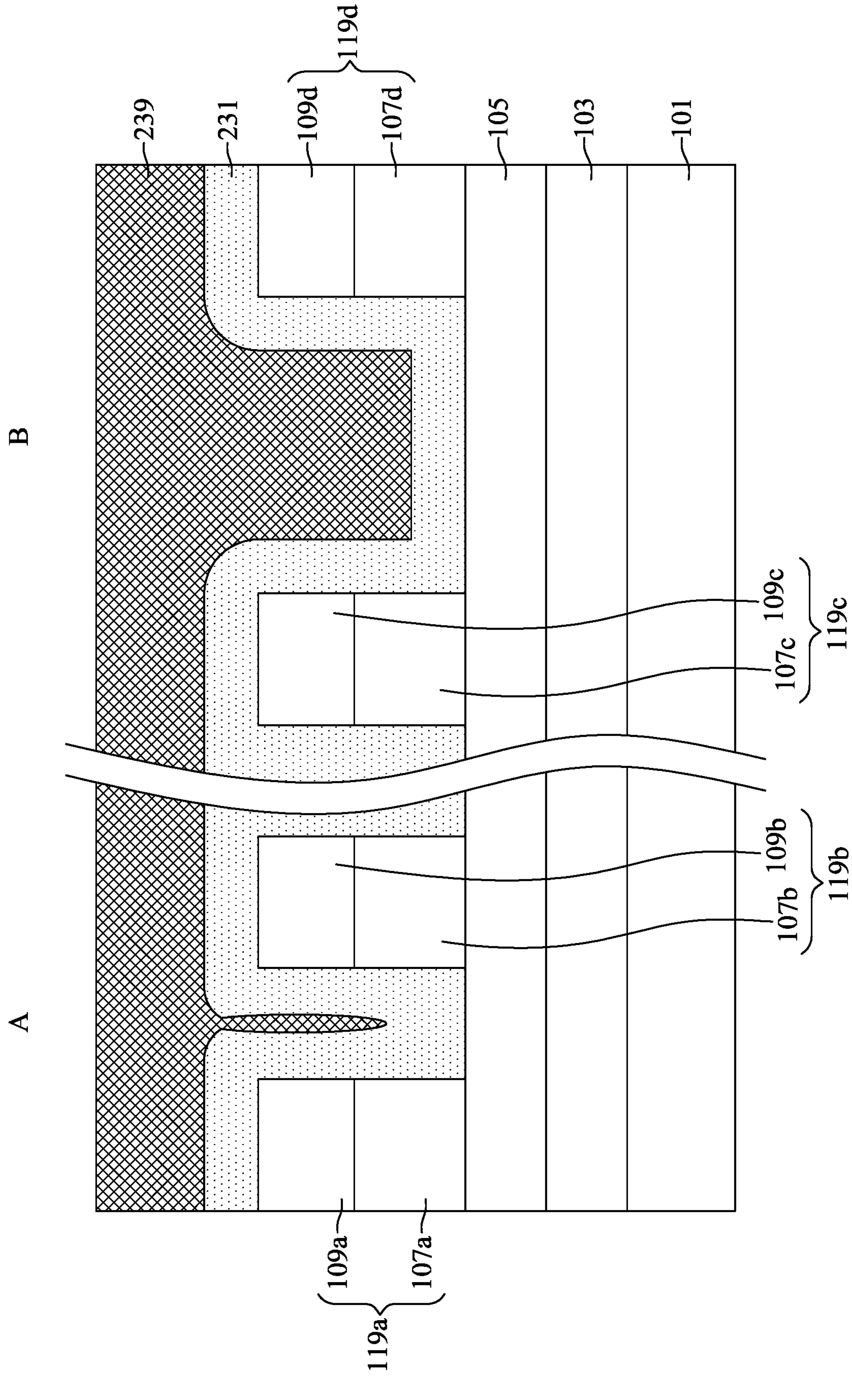
FIG. 19 is a cross-sectional view illustrating an intermediate stage of forming a filling layer over the dielectric liner layer during the formation of the semiconductor device structure, in accordance with some embodiments.
Figure 20:
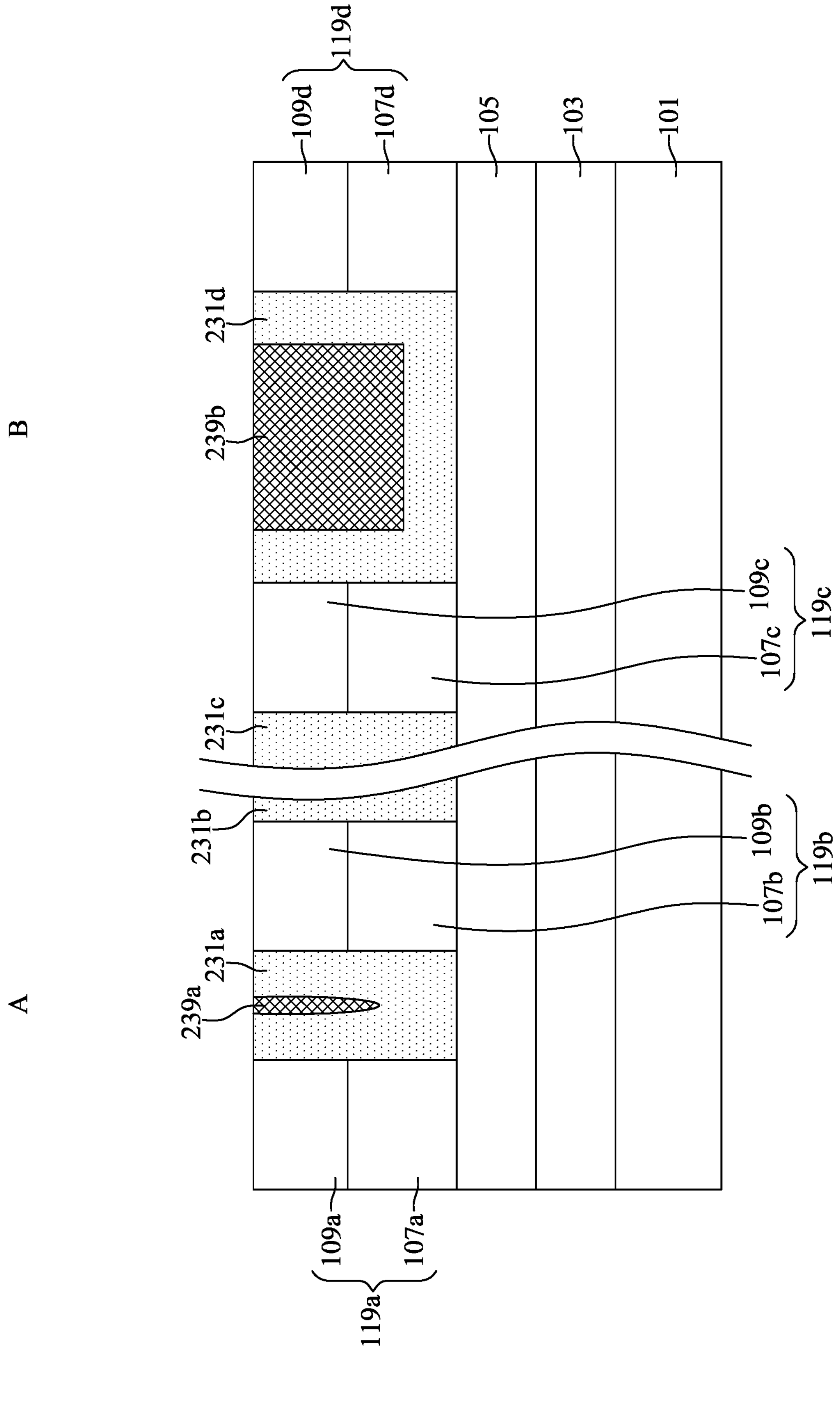
FIG. 20 is a cross-sectional view illustrating an intermediate stage of partially removing the filling layer and the dielectric liner layer to expose the second conductive layer during the formation of the semiconductor device structure, in accordance with some embodiments.

FIGS. 19 and 20 are cross-sectional views illustrating intermediate stages of forming the semiconductor device structure **200*b*, in accordance with some embodiments. It should be pointed out that operations for forming the semiconductor device structure 200*b* before the structure shown in FIG. 19 are substantially the same as the operations for forming the semiconductor device structure 200*a* shown in FIG. 16**, and the related detailed descriptions may refer to the foregoing paragraphs and are not discussed again herein.

After the dielectric liner layer 231 is formed, a filling layer 239 is formed over the dielectric liner layer 231, as shown in FIG. 19 in accordance with some embodiments. In some embodiments, the gap 234 and the opening 126' are filled by the filling layer 239. The respective step is illustrated as the step S43 in the method 30 shown in FIG. 6.

In some embodiments, the filling layer 239 is made of or includes an energy removable material. The details of the energy removable material may be essentially the same as what are shown and discussed in FIG. 14, and hence are not repeated herein. In some embodiments, the filling layer 239 is formed by a sputtering process. However, any other suitable deposition methods may be utilized.

Next, the filling layer 239 and the dielectric liner layer 231 are partially removed to expose the interconnect structures **119*a*, 119*b*, 119*c* and 119*d* (i.e., the second conductive portions 109*a*, 109*b*, 109*c* and 109*d*), as shown in FIG. 20 in accordance with some embodiments. The respective step is illustrated as the step S45 in the method 30 shown in FIG. 6. After the filling layer 239 and the dielectric liner layer 231 are partially removed, dielectric liner portions 231*a*, 231*b*, 231*c*, 231*d* and filling portions 239*a* and 239*b*** are obtained.

In some embodiments, the dielectric liner portions **231*a*, 231*b* and the filling portion 239*a* are in the first region A, and the dielectric liner portions 231*c*, 231*d*, and the filling portion 239***b* are in the second region B. In some embodiments, the filling layer 239 and the dielectric liner layer 231 are partially removed by a planarization process, an etch-back process, or a combination thereof. The planarization process may include a CMP process.

Subsequently, a cover layer 141 is formed over the interconnect structures 119*a*, 119*b*, 119*c*, and 119*d*, as shown in FIG. 4 in accordance with some embodiments. In some embodiments, the cover layer 141 is formed over and in direct contact with the top surfaces of the interconnect structures 119*a*, 119*b*, 119*c*, 119*d* (i.e., the top surfaces of the second conductive portions 109*a*, 109*b*, 109*c*, 109*d*), the top surfaces of the dielectric liner portions 231*a*, 231*b*, 231*c*, 231*d*, and the top surfaces of the filling portions 239*a* and 239*b*. The respective step is illustrated as the step S47 in the method 30 shown in FIG. 6.

The details of the cover layer 141 may be essentially the same as what are shown and discussed in FIG. 1, and hence are not repeated herein. After the cover layer 141 is formed, the semiconductor device structure 200*b* is obtained. In some embodiments, a heat treatment process can be performed to transform the filling portions 239*a* and 239*b* into air gaps (not shown). In some embodiments, the heat treatment process is optional. In some embodiments, the temperature used in the heat treatment process may be high enough to efficiently burn-out the filling portions 239*a* and 239*b*, such that air gaps are formed. In some other embodiments, the temperature used in the heat treatment process is selected such that an air gap surrounded or enclosed by a remaining portion of the filling portion is obtained in the first region A and/or the second region B of the semiconductor device structure 200*b*.

Embodiments of the semiconductor device structure and method for preparing the same are provided in the disclosure. In some embodiments, the semiconductor device structure (e.g., the semiconductor device structure 100*a* or 100*b*) includes a first interconnect structure, a second interconnect structure, a first dielectric liner portion disposed adjacent to the first interconnect structure, and a second dielectric liner portion disposed adjacent to the second interconnect structure. The semiconductor device structure also includes a filling portion surrounded by the second dielectric liner portion, and an air gap is enclosed in the first dielectric liner portion, which helps to reduce the capacitive coupling between adjacent interconnect structures, and RC delay can be decreased. As a result, performance (e.g., operation speed) and reliability of the semiconductor device structure can be improved.

In some embodiments, the semiconductor device structure (e.g., the semiconductor device structure 200*a* or 200*b*) includes a first interconnect structure, a second interconnect structure, a first dielectric liner portion disposed adjacent to the first interconnect structure, and a second dielectric liner portion disposed adjacent to the second interconnect structure. The semiconductor device structure also includes a first filling portion surrounded by the first dielectric liner portion, and a second filling portion surrounded by the second dielectric liner portion, the material(s) of the first filling portion and the second filling portion can be selected to reduce the capacitive coupling between adjacent interconnect structures, and RC delay can be decreased. As a result, performance (e.g., operation speed) and reliability of the semiconductor device structure can be improved. Moreover, the first filling portion and the second filling portion with different widths can be formed from the same material(s) with the same process step(s). Therefore, manufacturing cost and processing time can be reduced.

In one embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first interconnect structure and a second interconnect structure disposed over the second dielectric layer. The semiconductor device structure further includes a first dielectric liner portion disposed adjacent to the first interconnect structure. An air gap is enclosed in the first dielectric liner portion. In addition, the semiconductor device structure includes a second dielectric liner portion disposed adjacent to the second interconnect structure, and a filling portion surrounded by the second dielectric liner portion.

In another embodiment of the present disclosure, a semiconductor device structure is provided. The semiconductor device structure includes a first dielectric layer disposed over a semiconductor substrate, and a second dielectric layer disposed over the first dielectric layer. The semiconductor device structure also includes a first interconnect structure and a second interconnect structure disposed over the second dielectric layer. The semiconductor device structure further includes a first dielectric liner portion disposed adjacent to the first interconnect structure, and a second dielectric liner portion disposed adjacent to the second interconnect structure. In addition, the semiconductor device structure includes a first filling portion surrounded by the first dielectric liner portion, and a second filling portion surrounded by the second dielectric liner portion. A material of the first filling portion is the same as a material of the second filling portion, and a width of the second filling portion is greater than a width of the first filling portion.

In yet another embodiment of the present disclosure, a method for preparing a semiconductor device structure is provided. The method includes forming a first dielectric layer over a semiconductor substrate, and forming a second dielectric layer over the first dielectric layer. The method also includes forming a first conductive layer over the second dielectric layer, and forming a second conductive layer over the first conductive layer. The method further includes forming a first opening and a second opening each penetrating through the first conductive layer and the second conductive layer. A width of the second opening is greater than a width of the first opening. In addition, the method includes forming a dielectric liner layer in the first opening and the second opening, and forming a filling layer over the dielectric liner layer. A remaining portion of the second opening is filled by the filling layer. The method also includes partially removing the filling layer and the dielectric liner layer to expose the second conductive layer.

The embodiments of the present disclosure have some advantageous features. In some embodiment, the semiconductor device structure includes a first dielectric liner portion and a second dielectric liner portion disposed adjacent to a first interconnect structure and a second interconnect structure, respectively. The semiconductor device structure also includes a filling portion surrounded by the second dielectric liner portion, and an air gap is enclosed in the first dielectric liner portion, which helps to reduce the capacitive coupling between adjacent interconnect structures, and RC delay can be decreased. As a result, performance and reliability of the semiconductor device structure can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:

a first dielectric layer disposed over a semiconductor substrate;

a second dielectric layer disposed over the first dielectric layer;

a first interconnect structure and a second interconnect structure disposed over the second dielectric layer, wherein a bottom surface of the first interconnect structure and a bottom surface of the second interconnect structure are in contact with a top surface of the second dielectric layer;

a first dielectric liner portion disposed adjacent to the first interconnect structure;

a second dielectric liner portion disposed adjacent to the second interconnect structure;

a first filling portion surrounded by the first dielectric liner portion;

a second filling portion surrounded by the second dielectric liner portion, wherein a material of the first filling portion is the same as a material of the second filling portion, and a width of the second filling portion is greater than a width of the first filling portion; and a third interconnect structure and a fourth interconnect structure disposed over the second dielectric layer to form a first opening between the first interconnect structure and the third interconnect structure and a second opening between the fourth interconnect structure and the second interconnect structure, wherein the first dielectric liner portion is disposed between the first interconnect structure and the third interconnect structure and within the first opening, and the second dielectric liner portion is disposed between the second interconnect structure and the fourth interconnect structure and within the second opening;

wherein a material of the first dielectric liner portion is the same as a material of the second dielectric liner portion;

wherein a width of the second opening is greater than a width of the first opening;

wherein the width of the first opening is greater than the width of the first filling portion while the width of the second opening is greater than the width of the first filling portion;

wherein the bottom surface of the first interconnect structure, the bottom surface of the second interconnect structure, a bottom surface of the first dielectric liner portion, and a bottom surface of the second dielectric liner portion are coplanar with each other;

wherein a top surface of the first interconnect structure, a top surface of the second interconnect structure, a top surface of the first filling portion, a top surface of the second filling portion, a top surface of the first dielectric liner portion, and a top surface of the second dielectric liner portion are coplanar with each other;

wherein each of the first interconnect structure, the second interconnect structure, the third interconnect structure, and a fourth interconnect structure comprises a first conductive layer formed on and in contact with the top surface of the second dielectric layer and a second conductive layer formed on and in contact with a top surface of the first conductive layer;

wherein the first filling portion is disposed in the first dielectric liner portion at a position that the first filling portion is extended from a horizontal level of a top surface of the second conductive layer to a horizontal level below a top surface of the first conductive layer, such that a bottom surface of the first filling portion is positioned between the top surface of the first conductive layer and a bottom surface of the first conductive layer;

wherein the second filling portion is disposed in the second dielectric liner portion at a position that the second filling portion is extended from the horizontal level of the top surface of the second conductive layer to the horizontal level below the top surface of the first conductive layer, such that a bottom surface of the second filling portion is positioned between the top surface of the first conductive layer and the bottom surface of the first conductive layer;

wherein the material of the first dielectric liner portion and the material of the second dielectric liner portion include boron carbonitride (BCN), wherein the first conductive layer is a barrier layer.

2. The semiconductor device structure of claim 1, wherein a bottom width of the second dielectric liner portion is greater than a bottom width of the first dielectric liner portion, wherein the top surface of the first filling portion is exposed from the top surface of the first dielectric liner portion and is coplanar with the top surface of the second conductive layer while the top surface of the second filling portion is exposed from the top surface of the second dielectric liner portion and is coplanar with the top surface of the second conductive layer.

3. The semiconductor device structure of claim 1, wherein the first filling portion is separated from the second dielectric layer by the first dielectric liner portion, and the second filling portion is separated from the second dielectric layer by the second dielectric liner portion, wherein the first conductive layer and the second conductive layer are made of different conductive materials.

4. The semiconductor device structure of claim 3, wherein the first filling portion is separated from the first interconnect structure by the first dielectric liner portion, and the second filling portion is separated from the second interconnect structure by the second dielectric liner portion, wherein the first conductive layer is made titanium nitride (TiN), and the second conductive layer is made of tungsten (W).

5. The semiconductor device structure of claim 1, further comprising:

a cover layer disposed over and in direct contact with the top surface of the second conductive layer of the first interconnect structure, the top surface of the second conductive layer of the second interconnect structure, the top surface of the second conductive layer of the third interconnect structure, the top surface of the second conductive layer of the fourth interconnect structure, the top surface of the first dielectric liner portion, the top surface of the second dielectric liner portion, the top surface of the first filling portion, and the top surface of the second filling portion.

6. The semiconductor device structure of claim 5, wherein the cover layer includes silicon nitride ($Si_3N_4$), silicon oxynitride (SiON), silicon dioxide ($SiO_2$), or carbonitride.

7. The semiconductor device structure of claim 1, wherein the first dielectric liner portion is in direct contact with the first interconnect structure and the third interconnect structure, and the second dielectric liner portion is in direct contact with the second interconnect structure and the fourth interconnect structure;

wherein the first dielectric liner has a U-shaped cross section and forms a third opening to receive the first filling portion therein;

wherein the second dielectric liner has a U-shaped cross section and forms a fourth opening to receive the second filling portion therein;

wherein a bottom of the third opening is positioned between the top surface of the first conductive layer and the bottom surface of the first conductive layer;

wherein a bottom of the fourth opening is positioned between the top surface of the first conductive layer and the bottom surface of the first conductive layer;

wherein a width of the third opening is less than a width of the fourth opening.

8. The semiconductor device structure of claim 1, wherein the material of the first filling portion and the material of the second filling portion include an energy removable material.

* * * * *